US009993386B2

(12) United States Patent
Racette

(10) Patent No.: US 9,993,386 B2
(45) Date of Patent: Jun. 12, 2018

(54) INSTRUMENTATION ABSOLUTE VALUE DIFFERENTIAL AMPLIFIER CIRCUIT AND APPLICATIONS

(71) Applicant: Louis G. Racette, Portland, OR (US)

(72) Inventor: Louis G. Racette, Portland, OR (US)

( * ) Notice: Subject to any disclaimer, the term of this patent is extended or adjusted under 35 U.S.C. 154(b) by 785 days.

(21) Appl. No.: 14/556,077

(22) Filed: Nov. 28, 2014

(65) Prior Publication Data

US 2015/0150753 A1 Jun. 4, 2015

Related U.S. Application Data

(60) Provisional application No. 61/910,248, filed on Nov. 29, 2013, provisional application No. 61/970,902, filed on Mar. 27, 2014.

(51) Int. Cl.
*A61H 23/00* (2006.01)
*A61H 19/00* (2006.01)
(Continued)

(52) U.S. Cl.
CPC ............. *A61H 23/00* (2013.01); *A61H 19/00* (2013.01); *A61H 23/02* (2013.01); *H03F 3/211* (2013.01); *H03F 3/45475* (2013.01); *A61H 2201/165* (2013.01); *A61H 2201/5015* (2013.01); *A61H 2201/5043* (2013.01); *A61H 2201/5097* (2013.01); *A61H 2230/105* (2013.01); *H03F 2200/261* (2013.01); *H03F 2200/411* (2013.01); *H03F 2203/45512* (2013.01); *H03F 2203/45526* (2013.01); *H03F 2203/45528* (2013.01);
(Continued)

(58) Field of Classification Search
CPC .. A61H 23/00; A61H 23/02; A61H 2201/165; A61H 2201/5015; A61H 2201/5043; A61H 2201/5097; A61H 2230/105; A61H 19/00; H03F 3/45475; H03F 3/211; H03F 2203/45572; H03F 2203/45571; H03F 2203/45548; H03F 2203/45654; H03F 2203/45528; H03F 2203/45526; H03F 2203/45512; H03F 2200/411; H03F 2200/261; H03F 2203/45594; H03F 2203/45544
See application file for complete search history.

(56) References Cited

U.S. PATENT DOCUMENTS 3,299,287 A 1/1967 Staeudle
3,546,596 A 12/1970 Beaudette
(Continued)

*Primary Examiner* — Quang D Thanh
(74) *Attorney, Agent, or Firm* — Mersenne Law

(57) ABSTRACT

An instrumentation absolute value differential amplifier is used as part of an electroencephalogram, electromyogram or electrocardiogram to quantify the excitation state of a user, processing and transmitting this information as a control signal for a user feedback device. In one possible arrangement, this feedback device includes a wireless sex toy which responds to the sent control information, acting as a mind controlled sex toy. This provides a simple, intuitive, aesthetically appealing interface for creating a unique sexual experience. The use of an instrumentation absolute value differential amplifier is sufficient to monitor the desired signals while reducing the number of parts required and allowing for less precise tolerances than traditional biological monitoring circuits, thus decreasing the cost of production.

9 Claims, 23 Drawing Sheets

(51) Int. Cl.
*H03F 3/21* (2006.01)
*H03F 3/45* (2006.01)
*A61H 23/02* (2006.01)

(52) U.S. Cl.
CPC .............. *H03F 2203/45544* (2013.01); *H03F 2203/45548* (2013.01); *H03F 2203/45571* (2013.01); *H03F 2203/45572* (2013.01); *H03F 2203/45594* (2013.01); *H03F 2203/45654* (2013.01)

(56) References Cited

U.S. PATENT DOCUMENTS

| | | | |
|---|---|---|---|
| 4,558,239 A | | 12/1985 | Kim |
| 4,575,643 A | | 3/1986 | Sakai |
| 4,593,268 A | * | 6/1986 | Blauschild .............. H03M 1/44 330/100 |
| 4,663,544 A | | 5/1987 | Flora |
| 4,899,064 A | | 2/1990 | Neidorfi |
| 4,949,726 A | | 8/1990 | Hartzell |
| 5,703,518 A | | 12/1997 | Tamamoto |
| 7,865,235 B2 | | 1/2011 | Le |
| 7,938,789 B2 | | 5/2011 | Imboden |
| 8,155,736 B2 | | 5/2012 | Sullivan |
| 2004/0132439 A1 | | 7/2004 | Yagi |
| 2006/0270897 A1 | | 11/2006 | Homer |
| 2007/0236289 A1 | * | 10/2007 | Iriguchi .............. H03F 3/45179 330/253 |
| 2008/0177197 A1 | | 7/2008 | Lee |
| 2010/0127770 A1 | * | 5/2010 | Ikeda ....................... H03D 1/18 329/364 |
| 2010/0283539 A1 | * | 11/2010 | Yanagisawa ....... G01R 19/2503 330/127 |

* cited by examiner

INSTRUMENTATION ABSOLUTE VALUE DIFFERENTIAL AMPLIFIER CIRCUIT AND APPLICATIONS

CROSS-REFERENCE TO RELATED APPLICATIONS

This application claims the benefit of provisional patent application Ser. No. 61/910,248, filed Nov. 29, 2013 by the present inventor and Ser. No. 61/970,902, filed Mar. 27, 2014 by the present inventor.

BACKGROUND

Prior Art

The following is a tabulation of some prior art that presently appears relevant:

U.S. PATENTS

| Publication Number | Kind Code | Publication Date | Applicant |
| --- | --- | --- | --- |
| U.S. Pat. No. 2,318,207 | A | May 7, 1943 | Ellis Francis C |
| U.S. Pat. No. 4,202,354 | A | Jun. 9, 1978 | Leland Smith, Robert McIntyre, Raymond Pawlak |
| U.S. Pat. No. 4,610,259 | A | Aug. 31, 1983 | Daniel Cohen, Frederick Strobl |
| U.S. Pat. No. 4,949,726 | A | Mar. 29, 1988 | Rex Hartzell, E. Walters, Julian Gresser |
| U.S. Pat. No. 8,157,609 | B2 | May 17, 2012 | Stephen Hallaian, Stephen Lau, Joseph Franke |
| U.S. Pat. No. 6,154,669 | A | Nov. 28, 2000 | David Hunter |
| U.S. Pat. No. 8,301,218 | B2 | Oct. 30, 2012 | Tin Nguyen, Cheng-I Chuang |
| U.S. Pat. No. 8,780,512 | B2 | Jul. 15, 2014 | Thomas Sullivan |
| U.S. Pat. No. 8,396,529 | B2 | Mar. 12, 2013 | KooHyoung Lee, ByeongHyeop Choi |
| U.S. Pat. No. 8,155,736 | B2 | May 10, 2012 | Tom Sullivan, Arnaud Delorme, An Luo |
| USD565735 | S1 | Apr. 1, 2008 | Lori Ann Washbon |
| U.S. Pat. No. 4,928,704 | A | May 29, 1990 | James Hardt |
| U.S. Pat. No. 6,097,981 | A | Aug. 1, 2000 | Peter Freer |
| U.S. Pat. No. 6,090,037 | A | Jul. 18, 2000 | Benjamin Gavish |
| U.S. Pat. No. 5,692,517 | A | Dec. 2, 1997 | Andrew Junker |
| U.S. Pat. No. 8,326,408 | B2 | Dec. 4, 2012 | George Green, John Lemay |
| U.S. Pat. No. 7,865,235 | B2 | Jan. 4, 2011 | Tan Thi Thai Le |
| U.S. Pat. No. 6,368,268 | B1 | Aug. 17, 1998 | Warren Sandvick, Jim Hughes, David Atkinson |
| U.S. Pat. No. 7,643,795 | B2 | Jan. 5, 2010 | Arno Friedrichs, Bert Apitzsch |
| USD665093 | S | Aug. 7, 2012 | Filip Sedic |
| USD664932 | S | Aug. 7, 2012 | Filip Sedic |
| U.S. Pat. No. 7,938,789 | B2 | May 10, 2012 | Ethan Frederic Imboden |
| U.S. Pat. No. 6,814,695 | B1 | Nov. 9, 2004 | Michael Wyllie, Michael O'Leary |
| U.S. Pat. No. 6,480,405 | B2 | Nov. 12, 2002 | Ranjit Gharpurey |
| U.S. Pat. No. 4,941,080 | A | Jul. 10, 1990 | Gunther Sieborger |
| U.S. Pat. No. 5,703,518 | A | Dec. 30, 1997 | Syouhei Tamamoto |
| U.S. Pat. No. 8,823,453 | B2 | Sep. 2, 2014 | Olivier Nys, Francois Krummenacher |
| U.S. Pat. No. 3,311,835 | A | Mar. 28, 1967 | Peter Richman |
| U.S. Pat. No. 4,947,862 | A | Aug. 14, 1990 | Kevin Kelly |
| U.S. Pat. No. 3,531,656 | A | Sep. 29, 1970 | Stephan Ammann |
| U.S. Pat. No. 4,558,239 | A | Dec. 10, 1985 | Suk Kim, Hanfy Meleis |
| U.S. Pat. No. 3,546,596 | A | Dec. 8, 1970 | Richard Beaudette |
| U.S. Pat. No. 4,899,064 | A | Feb. 6, 1990 | Robert Neidorff |
| U.S. Pat. No. 4,518,877 | A | May 21, 1985 | William Hearn, Donald Rondeau |
| U.S. Pat. No. 3,299,287 | A | Jan. 17, 1967 | Hans Staeudle |
| U.S. Pat. No. 4,575,643 | A | Mar. 11, 1986 | Koichi Sakai |
| U.S. Pat. No. 4,663,544 | A | May 5, 1987 | Jay Flora, David Haycock |
| U.S. Pat. No. 2,822,474 | A | Feb. 4, 1958 | Alexander Boecker |

U.S. PATENT APPLICATION PUBLICATIONS

| Publication Number | Kind Code | Publication Date | Applicant |
| --- | --- | --- | --- |
| US20130130799 | A1 | May 5, 2013 | Marc Van Hulle, Nikolay V. Manyakov, Marijn Van Vliet |
| US20080177197 | A1 | Jul. 24, 2008 | KooHyoung Lee, Stanley Yang |
| US20070066914 | A1 | Mar. 22, 2007 | Tan Thi Thai Le |
| US20070173733 | A1 | Jul. 26, 2007 | Tan Le |
| US20070225585 | A1 | Jul. 27, 2012 | Lori Washbon, Emir Delic |
| US20120191000 | A1 | Jul. 26, 2006 | Shinobu Adachi, Jun Ozawa, Yoshihisa Terada, Koji Morikawa |
| US20060270897 | A1 | Nov. 30, 2006 | Gregg Horner |
| US20040132439 | A1 | Jul. 8, 2004 | Vic Yagi, Steve Farkas |
| US20080218472 | A1 | Sep. 11, 2008 | Randy Breen, Tan Thi Thai Le |

FOREIGN PATENT DOCUMENTS

| Foreign Doc. Nr. | Country Code | Kind Code | Publication Date | App or Patentee |
| --- | --- | --- | --- | --- |
| WO2008109699 | DE | A3 | Jan. 21, 2010 | Samuel Trewartha |
| WO2011002092 | JP | A1 | Jan. 6, 2011 | Tomohiro Hayakawa |
| WO2000056211 | KR | A1 | Sep. 28, 2000 | Kim Hyeong Seok |
| WO2007096595 | GB | A2 | Aug. 30, 2007 | Paul Kenny |
| KR20030090415 | KR | A | Nov. 28, 2003 | Hong Jang Sun, Kang Nam Cheon |
| WO2010108491 | DE | A1 | Sep. 30, 2010 | Dietmar Betat |
| DEI 02006034067 | DE | A1 | Jan. 24, 2008 | Kai-Use Solter |
| DE19709324 | DE | A1 | Sep. 10, 1998 | Roland Koplenig |
| DE102009014044 | DE | A1 | Sep. 30, 2010 | Stefan Steinkraus |
| WO2011077262 | IB | A2 | Jun. 30, 2011 | Audrey Shmakov |
| WO2013107446 | DE | A2 | Jul. 25, 2013 | Tobias Thiele, Julian Neumann |
| WO2005082312 | GB | A1 | Sep. 9, 2005 | Geoff Hollington |
| DE102004011397 | DE | A1 | Nov. 3, 2005 | Andreas Gotschel |
| DE10038271 | DE | A1 | Feb. 21, 2002 | Gerrit Kurt Roth |
| WO2013006264 | US | A3 | Sep. 6, 2013 | Filip Sedic |

NONPATENT SCIENTIFIC PUBLICATIONS

Heath, R. G. (1972) Pleasure and brain activity in man: Deep and surface electroencephalogram during orgasm. Journal of Nervous and Mental Disease, 154, p. 3-18.

Moan, C. E., & Heath, R. G. (1972) Septal stimulation for the initiation of heterosexual behavior in a homosexual male. Journal of Behavior Therapy and Experimental Psychiatry, 3, p. 23-30.

Mosovich, A., & Tallaferro, A. (1954) Studies on EEG and sex function orgasm. Diseases of the Nervous System, 15, p. 218-220.

Cohen, H. D., Rosen, R. C. & Goldstein, 1. (1976) Electroencephalographic laterality changes during human sexual orgasm. Archives of Sexual Behavior, 5, p. 189-199.

Sarrel, P. M., Foddy, J., & McKinnon, J. B. (1977) Investigation of human sexual response using a cassette recorder. Archives of Sexual Behavior, 6, p. 341-348.

Semmlow, J & Lubowsky, J. (1983). Sexual Instrumentation. Biomedical Engineering, IEEE Transactions on, BME-30, 6, p. 309-319.

Graber, B. & Rohrbaugh, J. (1985) EEG during masturbation and ejaculation. Archives of Sexual Behavior, 14 (6), p. 491-503.

Holstege, G., Georgiadis, J. & Paans, A (2003). Brain Activation during Human Male Ejaculation. The Journal of Neuroscience, 23(27) p. 9185-9193.

NONPATENT CIRCUITRY PUBLICATIONS

Nahhas, A. (2013). Differential Precision Rectifier using Single CMOS DVCC. International Journal of Computer Applications, 67, 7.

Carter, B. & Brown, T. (2001). Handbook of Operational Amplifier Applications. Retrieved from: http://www.ti.com/lit/an/sboa092a/sboa092a.pdf Jones, D. & Stitt, M. (2000) Precision Absolute Value Circuits. Burr-Brown Application Bulletin. Retrieved from: http://www.ti.com/lit/an/sboa068/sboa068.pdf Wong, J. A Collection of Amp Applications. AN-106 Application Note. Retrieved from: http://www.analog.com/static/imported-files/application_notes/28080533AN106.pdf Carter, B. (2000) A Single-Supply Op-Amp Circuit Collection. Application Report. Retrieved from: https://courses.cit.cornell.edu/bionb440/datasheets/SingleSupply.pdf Texas Instruments (2013) AN-31 Op Amp Circuit Collection. Application Report. Retrieved from: http://www.ti.com/lit/an/snla140b/snla140b.pdf Texas Instruments (2013) AN-20 An Applications Guide for Op Amps. Application Report. Retrieved from: http://www.ti.com/lit/an/snoa621c/snoa621c.pdf Zumbahlcen, H. (2007) Basic Linear Design. Analog Devices. Retrieved from: http://www.analog.com.library/analogdialogue/archives/43-09/EDCh %202%20other %20linear %20circuits.pdf National Semiconductor (1978). Op Amp Circuit Collection. Retrieved from: http://www.ti.com/ww/en/bobpease/assets/AN-31.pdf Gerstenhaber, M. & Malik, R. (2010). More Value from Your Absolute Value Circuit—Difference Amplifier Enables Low-Power, High-Performance Absolute Value Circuit. Analog Dialogue 44-04 Back Burner.

St. Angel, L. (1992) Dual op amp takes absolute difference. EDN. Retrieved from: http://m.eet.com/media/1159670/6-7%20design %20ideas.pdf

NONPATENT WEB LOGS

Scott, E. M. (2012, Nov. 24). Hacking My Vagina [web log post]. Retrieved from: http://scanlime.org/2012/11/hacking-my-vagina/

NONPATENT MOTION PICTURES

Bratter, S. (Producer), Catalano, P. (Producer) & Brambilla, M. (Director). (1993). Demolition Man [Motion Picture]. United States: Warner Bros.

Everett. G. (Producer) & Leonard, B. (Director). (1992). The Lawnmower Man [Motion Picture]. United States: Columbia TriStar & New Line Cinema.

NONPATENT PRESENTATIONS

Machulis, K. (2007, October 6). "Getting The Message Across" Presentation at Arse Elektronika 2007. Retrieved from: https://www.youtube.com/watch?v=cfs3srL_F4k The prior art relevant to this design falls into 10 areas: Instrumentation Amplifier Circuits, Absolute Value Amplifier Circuits, publicly available prior art, scientific research on sexual arousal using Electroencephalogram (EEG), commercialized consumer EEGs, Biofeedback technology, Computer Controlled Sex Toys, Network based sex toys, Wireless Sex Toys and Biometric Feedback Sex Toys.

INSTRUMENTATION AMPLIFIER CIRCUITS

Instrumentation Amplifiers allow amplification of low-voltage signals by a specified gain; these amplifiers include input buffer circuitry that allows measurement of weak signals, such as occurs with biological voltage measurement. Texas Instruments provides technical specifications for building a basic instrumentation amplifier using either two or three operational amplifiers with a single power supply (Carter, 2000), as does Analog Devices (Zumbahlen, 2007) and National Semiconductor (National Semiconductor, 2002). Traditional instrumentation amplifier designs require dual power supplies and a large number of precision components, leading to expensive production costs.

An instrumentation amplifier used in body composition analysis is described in U.S. Pat. No. 4,947,862, 1990; this circuit does not make use of absolute value analysis. A rail-to-rail input range instrumentation amplifier (U.S. Pat. No. 8,823,453, 2014) also does not use absolute value analysis. An instrumentation amplifier using high-impedance input bias is described in (U.S. Pat. No. 4,558,239, 1985)—this amplifier performs an absolute value comparison to a given magnitude, but does not output the absolute value for analysis.

ABSOLUTE VALUE AMPLIFIER CIRCUITS

There has been a substantial amount of work done on processing the absolute value of an electrical signal. The earliest such patents cover an absolute value computer (U.S. Pat. No. 2,822,474, 1958), operational rectifier (U.S. Pat. No. 3,311,835, 1967), precision rectifier (U.S. Pat. No. 3,531,656, 1970) and full-wave rectifiers (U.S. Pat. No. 4,575,643, 1986, U.S. Pat. No. 4,941,080, 1990 and U.S. Pat. No. 6,480,405, 2002). Similar absolute value amplifiers have been described in operational amplifier applications handbooks (Carter & Brown, 2001 and Wong), as have precision absolute value circuits (Jones & Stitt, 2000), an Absolute Value Amplifier with Polarity Detector (Texas Instruments, 2013), a Full-wave rectifier with an averaging filter (Texas Instruments, 2013) and a low-power, high-performance absolute value circuit (Gerstenhaber & Malik, 2010). An analog gate/switching circuit (U.S. Pat. No. 4,663,544, 1987) provides for both buffering of an input signal and outputting the absolute value of this signal, but not the absolute value of a difference between two signals. So, these patents only describe circuits that can provide the absolute value of one electrical input. A related circuit allows absolute value full-wave rectification of a signal in comparison to a reference voltage (U.S. Pat. No. 5,703,518, 1997), but without amplifying this difference.

The most relevant circuit designs involve amplifying the absolute value of the difference between two voltages, as is shown in a Circuit to obtain the absolute value of the difference between two voltages (U.S. Pat. No. 3,299,287, 1967), an Absolute value amplifier circuit (U.S. Pat. No. 3,546,596, 1970), a Precision absolute value amplifier for a precision voltmeter (U.S. Pat. No. 4,518,877, 1985) and an Absolute Value Differential Amplifier (U.S. Pat. No. 4,899,064, 1990). Similarly, a Differential Precision Rectifier (Nahhas, 2013) can be used to calculate the difference between two signals while a dual op amp can be used to compute absolute difference (St Angel, 1992). However, none of these amplifiers include buffers on input signals, making them unsuitable for low-impedance signal collection (as occurs with biological data).

PUBLICLY AVAILABLE PRIOR ART

Mental Control of Sexual Stimulation has long been viewed as science fiction. The motion pictures "The Lawnmower Man" (1992) and "Demolition Man" (1993) both show versions of hallucinatory helmets that allow users mental connection leading to orgasm. However, a practical, functional mind controlled sex toy has remained out of reach. Kyle Machulis (2007) proposed EEG as a potential sex toy, but failed to provide any specifics of how this could be done. Micah Elizabeth Scott (2012) described the possibility of induced feedback loops using sex toys; however, her implementation used an ultrasonic distance sensor instead of biometric feedback.

SCIENTIFIC RESEARCH

While substantial scientific research has been conducted on the correspondence between sexual arousal/orgasm and electroencephalogram readings, the results of these studies are often contradictory. Mosovich and Tallaferro (1954) reported EEG during masturbation and orgasm in male and female subjects, finding low-voltage rapid activity during the early stages of arousal, followed during orgasm by high-voltage "paroxysmal three per second waves which are mixed with rhythmic alternating muscular discharges"—but only on subjects who showed "evidence of body tension". Heath (1972) and Moan and Heath (1972) studied intracranial electrodes in a male and a female subject, finding paroxysmal spiking and intensified delta wave activity in the amygdalae/left caudate nucleus in association with orgasm. Cohen, Rosen and Goldstein (1976) demonstrated shifts in electrical energy through amplitude and frequency changes of EEG activity from dominant to non-dominant hemisphere during sexual arousal, asserting that EEG provides "a viable methodology for quantitative assessment of orgasmic response". Sarrel, Foddy and McKinnon (1977) reported an observable change in scalp EEG accompanying orgasm, but did not quantify their description. Semmlow and Lubowsky (1983) describe EEG as "a convenient measure of orgasmic response". However, Graber et al. (1985) were unable to replicate these experiments under controlled conditions, finding no specific correlation between EEG and arousal/orgasm. Graber's study did find predictable movement artifacts similar to those described by Mosovich and Tallaferro on some subjects; Graber's team discarded these as motion artifacts and/or activity in the brain's muscle control cortex. Holstege et al. (2003) mapped brain activation changes (specifically in the right neocortex and cerebellum) during ejaculation using Positron Emission Tomography, a related brain imaging technology. Thus, research on EEG has failed to find any specific electroencephalogram pattern that relates only to sexual arousal. However, the motion/muscle control artifacts discarded by Graber et al. provide correlations to sexual excitation that can be used to quantify arousal.

COMMERCIALIZED CONSUMER ELECTROENCEPHALOGRAMS

The original electroencephalogram, electrode and signal analysis concepts were developed within the scientific community, appearing in U.S. Pat. No. 2,318,207 (1943), U.S. Pat. No. 4,202,354 (1978) and U.S. Pat. No. 4,610,259 (1983). However, this technology was bulky and expensive, leading to use almost exclusively for scientific research. This paradigm changed in the early twenty-first century with the first consumer EEG toy: Interactive Product Line's Mindball (U.S. Pat. No. 7,988,557, 2011). This first game was also prohibitively expensive; further development within the consumer EEG field yielded cheaper and cheaper commercial EEG toys. Commercial EEG headsets (U.S. Pat. No. 6,154,669, 2000) allowed wearable EEG devices for consumer use. These toys were primarily aimed at a younger audience, promising to provide video game controls and learning/meditation software. While large corporations including Sony (WO2011002092, 2011), Mattel (U.S. Pat. No. 8,157,609, 2012 and US20130130799, 2013) and Panasonic (US20120191000, 2012) developed some EEG systems, the bulk of development was conducted by two smaller companies: Emotiv and Neurosky. Emotiv's patents cover electrode headset designs (US20070225585, 2007, WO2008109699, 2008 and U.S. Pat. No. 565,735, 2008) intended to support a number of electrodes in a futuristic case along with application-specific patents on interpreting user mental states through signal analysis (U.S. Pat. No. 7,865,235, 2011, US20070173733, 2007, US20070066914, 2007 and US20080218472, 2008). Neurosky's patents cover specific electrode designs (U.S. Pat. No. 8,301,218, 2012 and U.S. Pat. No. 8,396,529, 2013), circuit designs (U.S. Pat. No. 8,780,512, 2014) sensory evoked potential designs for controlling devices (U.S. Pat. No. 8,155,736, 2012) and Mental state detection within users (US20080177197, 2008). While several of these patents/applications describe mental state analysis using EEG, none specify a sex toy as a potential application. The closest is Neurosky's patent on stimulus-locked control of external devices using EEG (U.S. Pat. No. 8,155,736, 2012)—but this design is based on "a stimulus-locked average signal of a plurality of EEG signal samples". This means that the design requires some known input (such as a visual cue) in order to function correctly. Another patent (U.S. Pat. No. 4,949,726, 1990) describes an apparatus responsive to changes in brainwave patterns. Similarly, Emotiv's U.S. Pat. No. 7,865,235 (2011) describes classification of mental states within a subject, but requires comparison to predetermined responses in order to attempt to gauge the user's emotional state. While a substantial body of work exists on EEG components and analysis methods, no commercial EEG allows control of a sex toy based on mental/facial states.

BIOFEEDBACK

The concept of creating a feedback loop using Electroencephalogram has been developed and patented by a variety of corporations, typically for therapeutic or training purposes. The earliest such patent involves training users to generate desired EEG signals (U.S. Pat. No. 4,928,704, 1990) within an auditory/visually controlled environment. Similar biofeedback work is covered in U.S. Pat. No. 6,097,981 (2000), which describes controlling a computer animation using an Electroencephalogram and infrared data transmission protocols. More generally, U.S. Pat. No. 6,090,037 (2000) covers modification of biorhythmic activity using a force-transducer belt to control user interaction. U.S. Pat. No. 5,692,517 (1997) describes allowing a user to control a device using Electroencephalogram and Electromyogram signals, but specifies calculation of quadrature, limiting the device to measurement of frequency for periodic signals. Similarly, U.S. Pat. No. 8,326,408 (2012) covers a training method for controlling physical objects using EEG, but requires capturing two brain waves and determining their coherence and performing frequency calculations to control an object for visual cues. This patent does not cover tactile or sexual feedback from an EEG system. Finally, WO2000056211 (2011) covers brain wave signal analysis using an external computer, but does not allow for integrated sensors and analysis hardware. So, while biofeedback work has been conducted, none of these biofeedback mechanisms allow for a sex toy as a potential application.

COMPUTER CONTROLLED SEX TOYS

The concept of controlling a sex toy through a computer has been explored in a variety of methods. DE19709324 (1998) describes a microprocessor controlling the vibration intensity of "masturbation instruments" coupled to a walkman tape player. Ohmibod is currently the market leader in audio-responsive sex toys using similar methods, as described in U.S. Pat. No. 5,648,422 (1997). Computer-mediated methods of diagnosing premature ejaculation have also been developed (U.S. Pat. No. 6,814,695, 2004). Finally, WO2005082312 (2005) covers a body massager using a computer connection for wired control. However, none of these control schemes use biometric feedback for sexual pleasure.

NETWORK CONTROLLED SEX TOYS

Sex toy control over internet and/or network architecture has been developed in detail. U.S. Pat. No. 6,368,268 (2002) describes a coupled visual display and stimulation device intended to allow long-distance stimulation and synchronization between stimulation and visual cues. Similarly, DE102004011397 (2005) describes remote toy control in conjunction with erotic media. DE102009014044 (2010) and WO2011077262 (2011) cover multi-console systems allowing more than two users to interact through a central server. DE10038271 (2002) describes a networked vibrator with combination mobile telephone and camcorder. None of these systems describe a biometric feedback control scheme.

WIRELESS SEX TOYS

Wirelessly controlled and charged sex toys have been developed for commercial use, primarily by LELO, Inc. and JimmyJane, Inc. U.S. Pat. No. 7,643,795 (2010) describes a bluetooth-controlled remote vibrator with a separator transmission and receiver interface. JimmyJane's U.S. Pat. No. 7,938,789 (2011) describes an inductively chargeable massager (first described in U.S. Pat. No. 7,749,178, 2010) capable of responding to both direct and wireless user controls, with the possibility of being controlled by biofeedback (but only as part of a control network). US20040132439 (2004) describes a remotely controllable wireless sex toy that can be controlled either directly or through a computer network. LELO holds two design patents on wireless sex toy case designs (U.S. Pat. No. 665,093, 2012 and U.S. Pat. No. 664,932, 2012) along with a remote control personal massager application (WO2013006264, 2013).

BIOMETRIC FEEDBACK SEX TOYS

Several Biometric feedback massagers/masturbation devices have been proposed, but none have been commercialized. The first biometric massager patent is intended for use with a massage chair (US20020123704, 2002). A more specifically sexual patent application (KR20030090415, 2003) involves an integrated sex toy and biometric sensor. The first US patent application. Smart Sex Toys (US20060270897, 2006) mentions controlling a vibrator through biological data—specifically pulse rate, blood pressure, body temperature, muscle contraction, respiration rate, respiration intensity or galvanic response—but not electroencephalogram or electromyogram. DE102006034067 (2008) specifies a vibrator controlled by biological arousal as determined by a microphone, muscle contractions, resistance of the skin and/or heart rate. WO2010108491 (2010) and DE102009015371 (2010) both describe a similar vibrator controlled by a heart rate sensor (gathered using a belt, cuff or loop-like body). WO2007096595 (2007) describes a stimulation device operating on biometric data-again specified as heart rate, muscular contractions and/or galvanic skin response.

The most relevant granted US patents that mention the possibility of neural feedback are U.S. Pat. No. 7,815,582 (2010) and U.S. Pat. No. 7,938,789 (2011), both of which specify wireless remote control massagers. In U.S. Pat. No. 7,815,582 (2010), this massager is capable of control under ZigBee protocols, which can include signals from biofeedback sensors. In U.S. Pat. No. 7,938,789 (2011), the massager capabilities are expanded to include biofeedback (including neural activity) under ZigBee control and to allow biofeedback information to be sent from the massager to an external transceiver. None of these patents/applications specify an electroencephalogram/electromyogram controlled wireless vibrator operating independent of a larger control network. This requirement of a control network increases the cost and device complexity to the end user, which is detrimental in the sex toy industry, where simplicity and ease of use are major selling points.

ADVANTAGES

While several previous inventors have speculated about biometric feedback sex toys, these have not been commercialized. Electroencephalogram control of a sex toy sounds like science fiction, but the technology is very real—the first embodiment specified in this patent has been built as a functional prototype. The use of radio control protocols without requiring a sensor mounted inside the massager or a control network reduces production costs and makes the device simpler to use, while the location of the electroencephalogram/electromyogram sensor on an external headband wirelessly linked to a receiving vibrator gives the user a truly unique mind-controlled sexual experience. Use of an instrumentation absolute value differential amplifier circuit reduces the manufacturing cost of such a device by decreasing the number of components necessary and allowing for lower precision parts than traditional biological monitoring circuits.

SUMMARY

In accordance with one embodiment an instrumentation absolute value differential amplifier circuit inside an electroencephalogram/electromyogram headband module wirelessly controls a separate remote vibrator, creating a mind-controlled sex toy.

DRAWINGS

LIST OF REFERENCE NUMERALS

Hardware Components:
100 (a/b): Input Signal
102 (a/b): Buffer Amplifier
104 (a/b/c/d): Resistor
106 (a/b): Differential Amplifier
108 (a/b/c/d): Resistor
110 (a/b): Diode
112: Output Signal
200: Resistor (Bias)
202: Resistor (Bias)
204 (a/b/c/d): Resistor
206 (a/b): Coupling Capacitor
208 (a/b): Electrode
210 (a/b/c/d): Zener Diode
212: Instrumentation Absolute Value Differential Amplifier
214: Capacitor
216: Microcontroller
218: Radio Transceiver
400: Headband
402: Vibrator
404: Battery Casing
406: Battery
408: Printed Circuit Board
410: Forehead Electrode
412: Ear Electrode
414: Power Switch
500: External Wireless Vibrator
502: Radio Transceiver (within external vibrator)
504: Microcontroller (within external vibrator)
506: Vibrating motor (within external vibrator)
800 (a/b/c/d): Resistor
802: Gain Resistor
804: Capacitor
806: Diode
808 (a/b/c/d): Resistor
810 (a/b): Operational Amplifier
900 (a/b): Instrumentation Amplifier
902 (a/b): Gain Resistor
904 (a/b): Diode
1000: Driven Right Leg Amplifier
1002: Driven Right Leg Electrode
1200: Arm Band
1202: Chest Electrode
1204: Reference Electrode
1300: Arm Band
1302: Muscle Electrode
1304: Reference Electrode
1400 (a/b): Transceiver
1402 (a/b): Personal Computer
1404: Internet Architecture
1500: Transceiver
1502: Microcontroller
1504: Storage device
1506: User Control
1600: Transceiver
1602: Personal Computer
1604: Interaction Software
1700: Video Game
1800: Transceiver
1802: Tone Generator
1804: Speaker
1900: Transceiver
1902: Microcontroller
1904: Toy Motor
1906: RC Toy
2000: Transceiver
2002: Microcontroller
2004: Graphic Display
2100: Amplified Signal Input
2102: Rectifier/Low-Pass Filter
2104: Comparator

2106: Digital Control Signal
2200: Complex Filter
Software States:
a: Microcontroller Initialization
b: Transceiver Initialization
c: Sample Count/Accumulator Reset
d: Analog-Digital Conversion Start
e: Analog-Digital Conversion Polling Loop
f: Accumulator Addition
g: Sample Count Increment
h: Sample Count Comparison
i: Accumulator Value Conversion
j: Transceiver Output
k: Reset Fourier Buffer, Sample Count
l: Store value in Fourier Buffer
m: Perform Fast Fourier Transform
n: Convert FFT Values to Desired Output

DETAILED DESCRIPTION

FIGS. 1,2,4-7

First Embodiment

Figure 1:
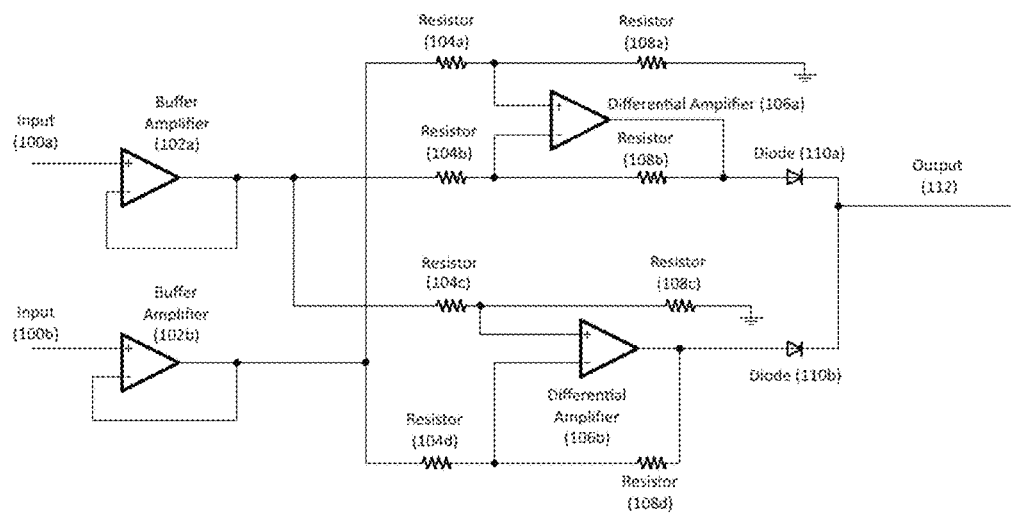
FIG. 1 is a circuit diagram showing the instrumentation absolute value differential amplifier isolated from any application circuit.

FIG. 1 shows the Instrumentation Absolute Value Differential Amplifier circuit diagram isolated from any application circuit. Input 100a is connected to Buffer Amplifier 102a; Input 100b is connected to Buffer Amplifier 102b. The output of the buffer amplifier 102a is connected to Resistors 104b and 104c; the output of buffer amplifier 102b is connected to Resistors 104a and 104d. Resistor 104a is connected to the positive input of Differential Amplifier 106a and Resistor 108a; Resistor 104b is connected to the negative terminal of Differential Amplifier 106a and Resistor 108b. Resistor 104c is connected to the positive input of Differential Amplifier 106b and Resistor 108c; Resistor 104d is connected to the negative terminal of Differential Amplifier 106b and Resistor 108d. Resistors 108a and 108c are connected to the circuit ground. Resistor 108b is connected to the output of Differential Amplifier 106a, and Resistor 108d is connected to the output of Differential Amplifier 106b. The output of Differential Amplifier 106a is also connected to the input of Diode 110a; the output of Differential Amplifier 106b is connected to the input of Diode 110b. The outputs of Diode 110a and 110b are then connected to the circuit Output 112. All four operational amplifiers required may be part of a single Quad Operational Amplifier package (such as the TLC274 amplifier), although other parts/packages may be used.

Figure 2:
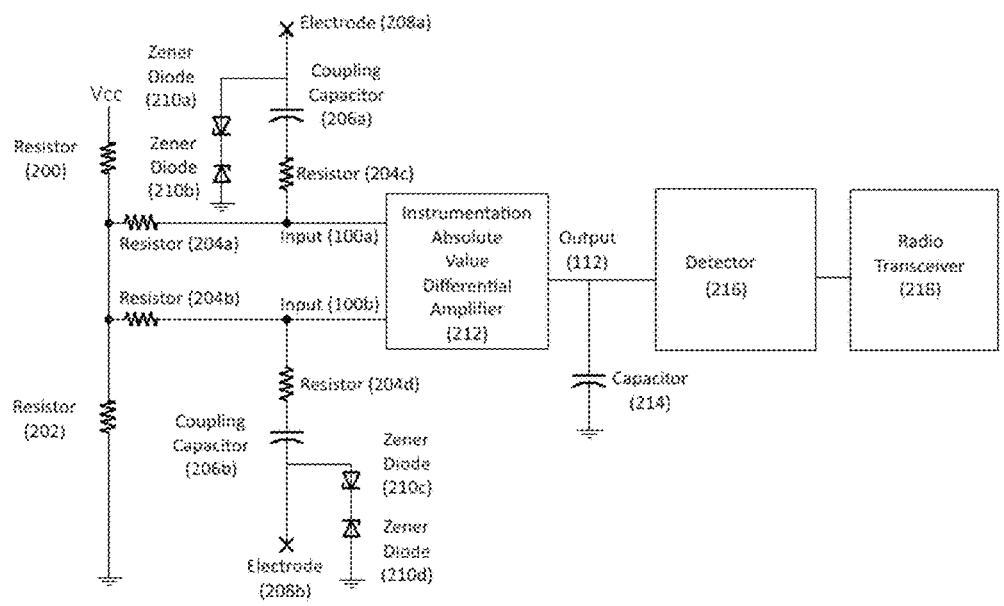
FIG. 2 shows an application EEG circuit for use with the instrumentation absolute value differential amplifier.

FIG. 2 shows an application circuit for the amplifier shown in FIG. 1. Resistor 200 is connected to the circuit's positive voltage source and Resistor 202. Resistor 202 is then connected to the circuit ground. Resistors 204a and 204b are connected to the junction between Resistors 200 and 202. Resistor 204c is connected to Resistor 204a and Coupling Capacitor 206a; Resistor 204d is connected to Resistor 204b and Coupling Capacitor 206b. Coupling Capacitor 206a is connected to Electrode 208a and Zener Diode 210a; Coupling Capacitor 206b is connected to Electrode 208b and Zener Diode 210c. Zener Diode 210a is connected to opposing Zener Diode 210b, which is connected to ground; Zener Diode 210c is connected to opposing Zener Diode 210d, which is also connected to ground. The junction of Resistors 204a and 204c is connected to the input 100a of Instrumentation Absolute Value Differential Amplifier 212; the junction of Resistors 204b and 204d is connected to the input 100b of Amplifier 212. The output 112 of Amplifier 212 is connected to capacitor 214, which is connected to the circuit ground. The junction of Output 112 and Capacitor 214 is connected to Detector 216, which in turn is connected to Radio Transceiver 218. Electrodes 208a and 208b may be of a wet (requiring a conductive fluid/paste) or dry (not requiring a conductive medium) design, active (requiring power to operate) or passive (not requiring a power source). The Zener Diodes pairs may be replaced with Varistors or other electro-static discharge protection devices. Detector 216 might be a PIC16F1825 microcontroller, although other microcontrollers, logic circuits or hardware state machines may be used. A CC2500 radio transceiver can be used for Transceiver 218, although other transceivers will suffice.

Figure 4:
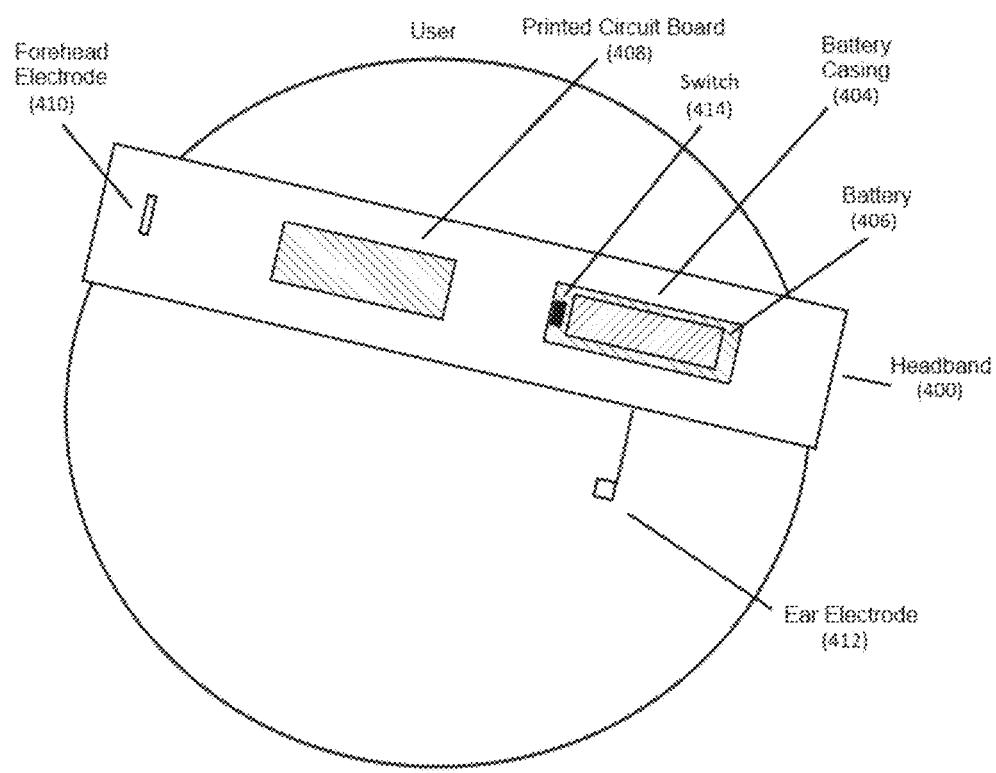
FIG. 4 shows a headband case representation for the application circuit.

FIG. 4 shows an external case layout for a headband 400. This headband contains and supports all other components. A battery case 404 holds a battery 406 and switch 414. An on/off power switch will suffice, but alternative switches, buttons, capacitive touch sensors or other sensors may also be used for this purpose. Two electrodes are placed in contact with the user's skin at the forehead (electrode 410) and ear (electrode 412). A printed circuit board 408 contains and connects all hardware circuitry used on the headband.

Figure 5:
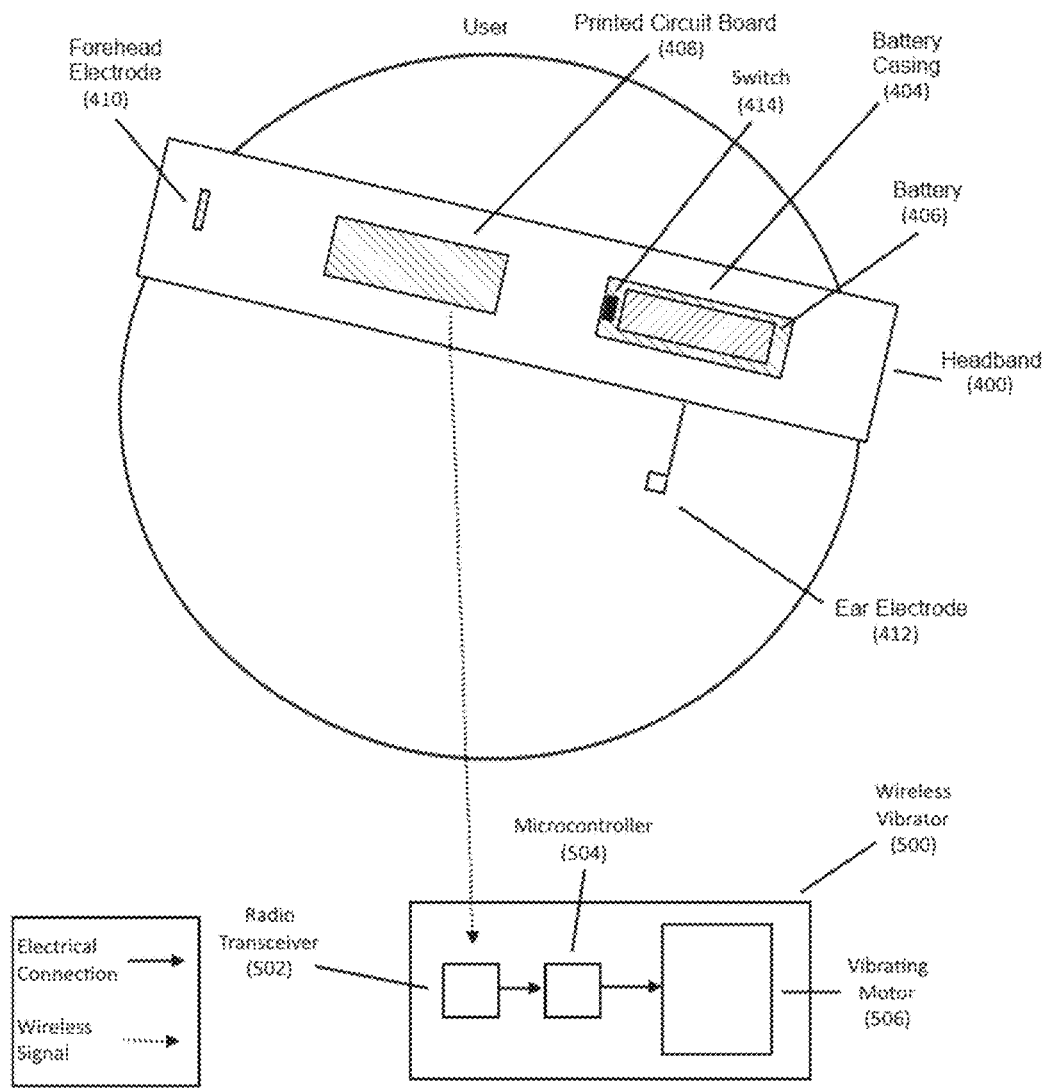
FIG. 5 shows the application headband paired with a wireless, radio controlled vibrator.

FIG. 5 shows the headband 400 sending a wireless signal to an external vibrator 500. This vibrator contains a Radio Transceiver 502 connected to a Microcontroller 504. This microcontroller is then connected to a vibrating motor 506. Remote-controlled vibrators such as Lelo, Inc.'s Lyla model can be used for this purpose. Alternative wireless signals (such as Zigbee, Bluetooth, ANT or infrared) or a direct electrical connection can also be used for communication between the headband and vibrator.

Figure 6:
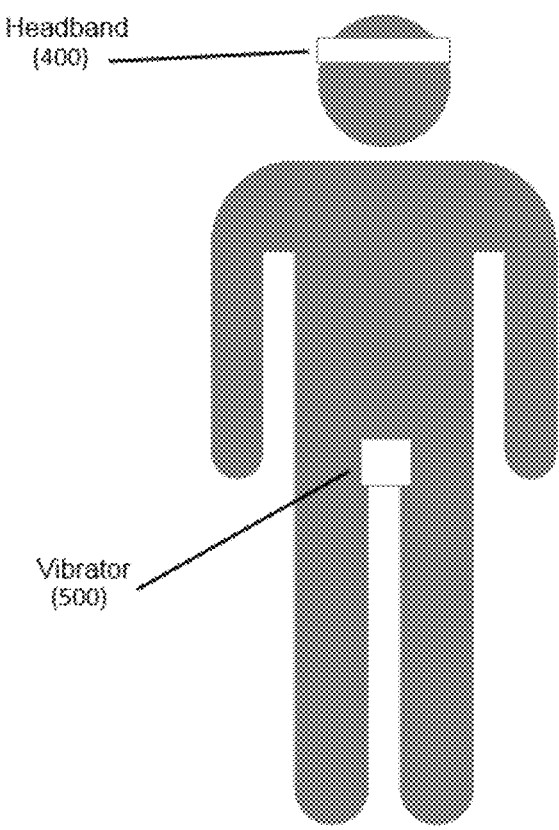
FIG. 6 shows a typical single person use case.

FIG. 6 shows a typical single-person use case for the proposed system. The headband 400 is worn by a user and supports all circuitry and sensors. The vibrator 500 is placed near the genitals or inserted into the vagina or anus of the user.

Figure 7:
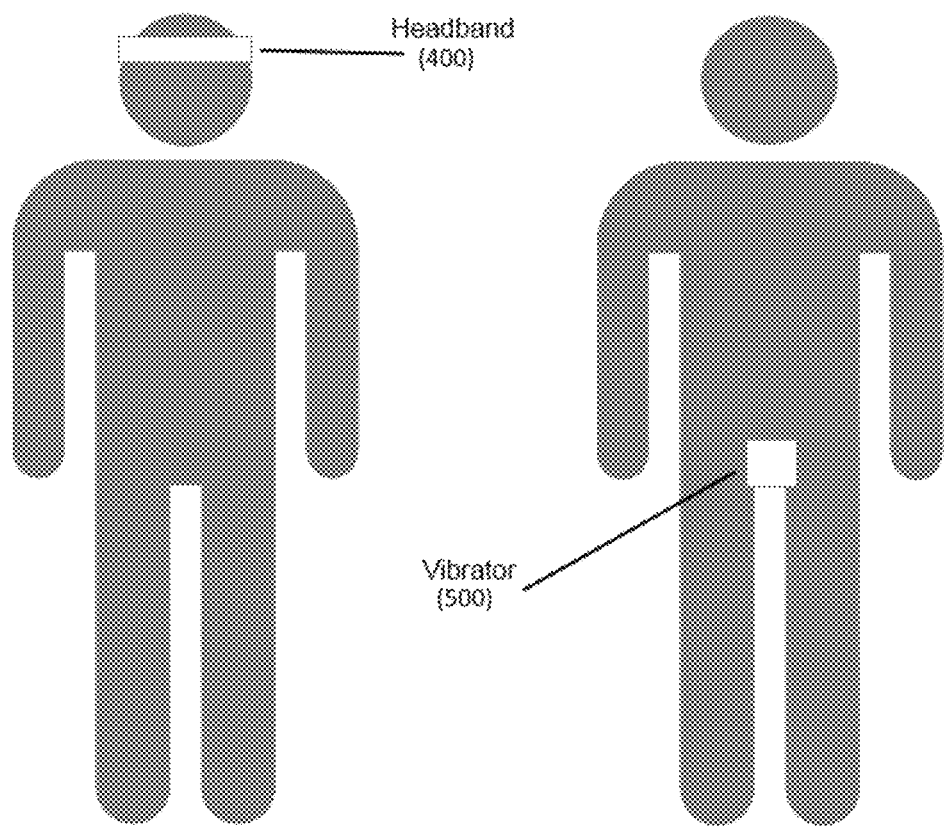
FIG. 7 shows a typical two-person use case.

FIG. 7 shows a typical two-person use case for the proposed system. The headband 400 supports all circuitry and sensors and is worn by a first user. The vibrator 500 is placed near the genitals or inserted into the vagina or anus of a second user.

Operation—FIGS. 1-7

FIG. 1 shows the Instrumentation Absolute Value Differential Amplifier circuit diagram in detail. The inputs 100a and 100b are sent through the Buffer Amplifiers 102a and 102b; this serves to provide a lower source impedance and constant current for these signals, minimizing the effect of later amplification on the source signals. Differential Amplifiers 106a and 106b amplify the two signals in a crossed arrangement, such that Differential Amplifier 106a output is the inverse of Differential Amplifier 106b. The Gain for differential Amplifiers 106a and 106b is set by the ratio of Resistors 108a-d to Resistors 104a-d (where Resistors 108a-d all have one Resistance value 108 and Resistors 104a-d all have another Resistance value 104); thus the Gain equals Resistance 108 divided by Resistance 104. The Differential Amplifier 106a output is then Input 100b minus Input 100c (multiplied by the Gain). Similarly, the Differential Amplifier 106b output is then Input 100a minus Input 100b (also multiplied by the gain). This gain is sufficient at 500, but other gains or resistance values may be used. These signals are then run through Diodes 110a and 110b, which only allow positive values to pass through (negative voltages result in a negligible voltage on the Diode). Thus, output 112 sends the absolute value of Input 100b minus Input 100a, multiplied by the Gain. This is accomplished without the need for precision matched resistors or dual power supplies, reducing component costs.

FIG. 2 shows an application circuit for bio-electric monitoring using the Instrumentation Absolute Value Differential Amplifier. Two bias resistors (200 and 202) are used to establish an intermediate voltage between the circuit power source and circuit ground. This bias voltage may also be run through a buffer amplifier to stabilize the bias current. Resistors 204a and 204b transmit this bias voltage to the two input lines and reduce signal crossover between the two. Electrodes 208a and 208b carry electrical charges from bio-electric sensors; Coupling Capacitors 206a and 206b prevent the circuit voltage from feeding back to the sensors (and the subject wearing them). Said electrodes may be dry or wet (requiring conductive gel), of a passive or active design. Zener Diodes 210a-d provide electrostatic discharge (ESD) protection—normally these carry negligible current, but in the event of high voltage (such as that caused by a static shock) these shunt the voltage to the circuit ground. Other ESD protection devices (such as varistors) may also be used to prevent shock damage. Resistors 204c and 204d reduce the voltage from the electrodes to a level that can be interpreted by the Instrumentation Absolute Value Differential Amplifier 212. This voltage is too small to be read by a typical Analog-to-Digital converter, so it is amplified by the Instrumentation Absolute Value Differential Amplifier 212. A gain of 500 is sufficient for this purpose, although other gains may be used. The output of said Amplifier is then filtered using capacitor 214 (removing high-frequency noise). Other filters (of low-pass, high-pass, band-pass, band-stop or notch design, passive or active) may be used for this purpose. The resulting signal is then read by the analog-to-digital converter (or alternative input) of detector 216. PIC16F1825 microcontrollers may be used for this purpose, although other microcontrollers/state machines/ logic circuits will suffice. The detector sends control signals to a radio transceiver 218, communicating the read voltage to another device.

Figure 3:
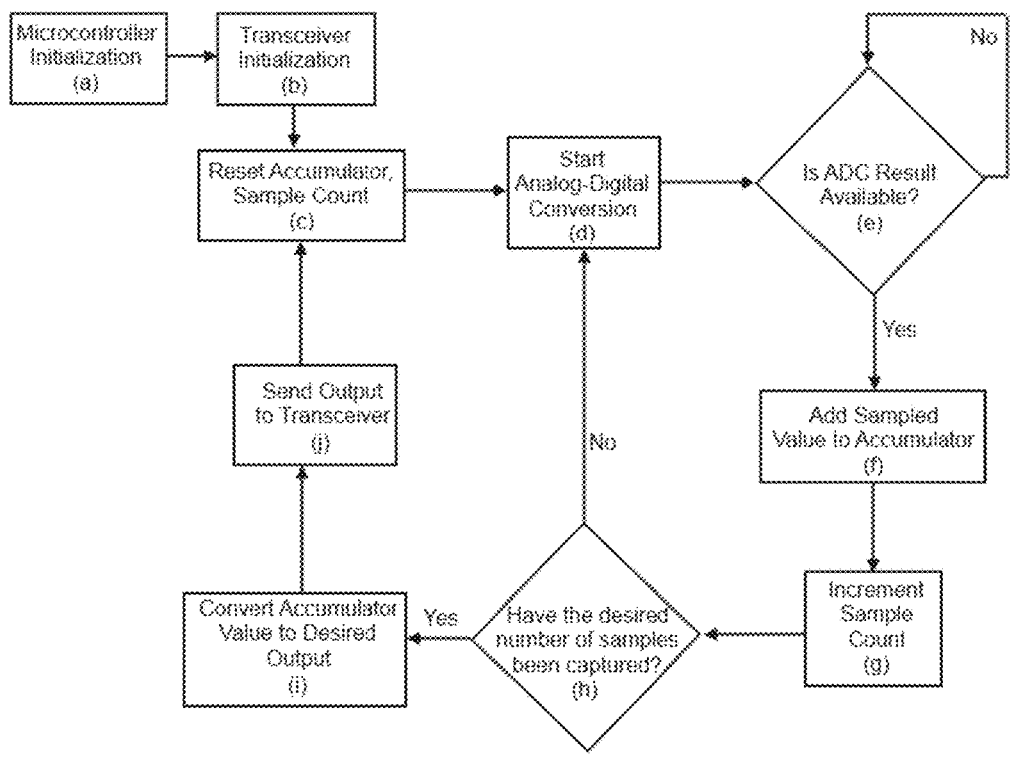
FIG. 3 shows a representation of software used for the detector in the application circuit.

FIG. 3 shows a software flow chart for a program intended to run on the detector 216 (when this detector is a programmable microcontroller). This flow chart describes a continual-operation loop. State a initializes the microcontroller and analog-to-digital converter. State b initializes the radio transceiver. State c resets the accumulator and sample count values. State d begins a sample operation within the ADC. State e polls the ADC unit until a result is available (conversion has finished). Once this result is ready, it is stored in the accumulator in state f. The sample count is then incremented in state g. This sample count value is then compared to the desired number of samples in state h. This desired number is sufficient at 1024, but other values may be used. If the number of samples has reached the desired value, then the accumulator value is translated into a signal that can be used within the transceiver in state 1. This translation can simply be dividing a constant term by the accumulator value, but other algorithms may be used (such as comparing the previous accumulator value to the current value and scaling appropriately). Algorithms may be optimized to provide a response proportional to the user's arousal or inverse to said arousal, creating a tantric state (deliberately prolonging the user's sexual experience). This value is then sent as a set of instructions to the radio transceiver in state j and the cycle repeats. The software continues operation until circuit power is depleted or the device is reset. This algorithm is sufficient to sample the application circuit for changes in the user's biological signals, but other algorithms may be used. This algorithm may also include any of several modifications, such as: checking whether the calculated result is within pre-defined thresholds to ensure valid electrical connections between the electrodes and the user, performing a Fast Fourier Transform on data accumulated within a storage buffer to extract only desired frequencies, storing accumulator values within a circular buffer and averaging this buffer to provide smoother transitions, calculating a baseline upon startup to compare with later accumulator values, and/or storing persistent user-specific data within the microcontroller to allow faster baseline calculation.

FIG. 4 shows the headband 400 components in more detail. The headband 400 fits snugly over the user's head, keeping the forehead electrode 410 in contact with the forehead. The battery case 404 provides electrical connections between the battery and circuitry components and contains an on/off switch 414 for controlling power to the circuit. The battery 406 provides power to these same circuitry components. The electrodes 410 and 412 transmit electrical signals to the printed circuit board 408. This printed circuit board contains all electronic components used within the Electroencephalogram reading circuit. The size, shape and material of the headband 400 may be varied to fit aesthetic and functional requirements.

FIG. 5 shows the headband 400 paired to a receiving vibrator 500. The vibrator contains a radio transceiver 502 which monitors radio frequencies for sent commands. Upon receiving a command, this information is sent to microcontroller 504; said microcontroller then alters the speed of vibrating motor 506 accordingly.

FIG. 6 shows a typical single-person use case for the proposed system. The headband 400 supports and contains all electrical components. The vibrator 500 provides sexual stimulation to the user.

FIG. 7 shows a typical two-person use case for the proposed system. The headband 400 supports and contains all electrical components and is worn by a first user. The vibrator 500 provides sexual stimulation to a second user. Description And Operation Of Alternate Embodiments— Figs. 8-23

In another embodiment (FIG. 8), buffer amplifiers are added to the absolute value differential amplifier developed by Lindo St Angel. The circuit uses an alternative differential absolute value amplifier to provide an absolute differential gain value of inputs 100a and 100b. Buffer Amplifiers 102a and 102b are connected to the inputs 100a and 100b, respectively. Resistors 800a and 800d are connected to the output of Buffer Amplifier 102a. Resistors 800b and 800c are connected to the output of Buffer Amplifier 102b. An amplifier 810a has a negative input connected to Resistors 800a, 808b and 802. The positive input of amplifier 810a is connected to Resistors 800b and 808a. The output of amplifier 810a is connected to capacitor 804 and the anode of diode 806. Capacitor 804 is also connected to Resistor 802. An Amplifier 810b has a positive input connected to the diode 806 cathode, Resistor 800d and Resistor 808b. Resistor 808b is connected to ground. The negative input of amplifier 810b is connected to Resistor 800c and Resistor 808c. The output of Amplifier 810b is connected to Resistor 808b and 808c; this output is then sent as Output 112.

Figure 8:
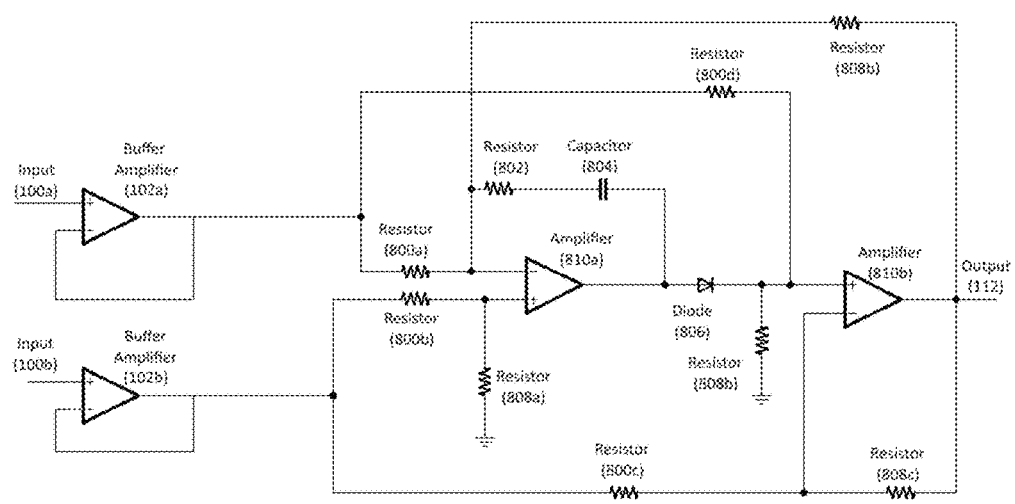
FIG. 8 shows an alternative absolute value amplifier design.

The embodiment shown in FIG. 8 provides an absolute value differential circuit with a specified gain. Two sets of Resistors (800 and 808) have uniform values. Resistance values for Resistors 800 and 808 provide the gain ratio, such that the gain is equal to Resistance 808 divided by Resistance 800. The Resistor 802 and Capacitor 804 are added to compensate for poor phase margin and instability. The output 112 is then equal to the absolute value of input 100*b* minus input 100*a* multiplied by the gain.

In another embodiment (FIG. 9), two instrumentation amplifiers 900*a* and 900*b* are cross-connected to inputs 100*a* and 100*b* such that the positive input of amplifier 900*a* is connected to input 100*a* and the negative input of amplifier 900*a* is connected to input 100*b* while the positive input of amplifier 900*b* is connected to input 100*b* and the negative input of amplifier 900*b* is connected to input 100*a*. The output of amplifier 900*a* is then sent through Diode 904*a*, while the output of amplifier 900*b* is sent through diode 904*b*. The cathodes of Diodes 904*a* and 904*b* are joined and connected to output 112. Gain resistors 902*a* and 902*b* are selected to set the gain on each amplifier.

Figure 9:
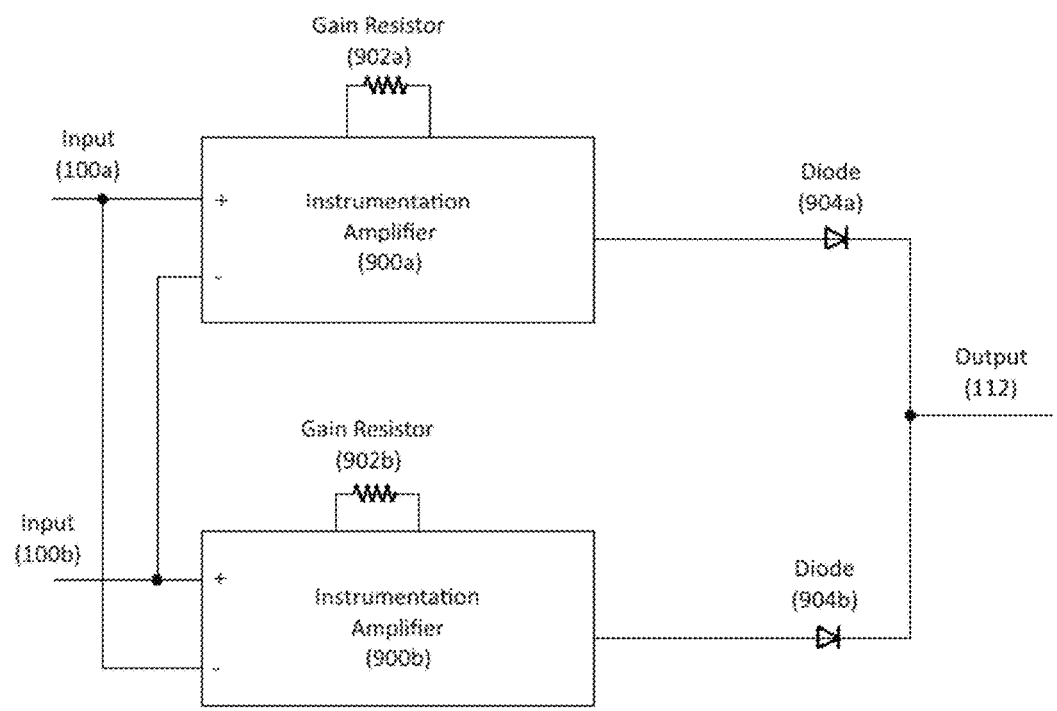
FIG. 9 shows an alternative amplifier layout using multiple instrumentation amplifiers.

The embodiment shown in FIG. 9 performs absolute value analysis using two instrumentation amplifiers. The instrumentation amplifiers contain buffer amplifiers for enhanced signal quality and have a programmable gain set by Resistors 902*a* and 902*b*. INA118 amplifiers may be used for this purpose, although other amplifiers will suffice. Each instrumentation amplifier outputs a voltage corresponding to the difference between input 100*a* and 100*b*; these differences are inverted. Diodes 904*a* and 904*b* allow only positive voltages to be transmitted, thus sending the amplified absolute value of the difference between input 100*a* and input 100*b* to output 112.

In another embodiment (FIG. 10), the application circuit features a Driven Right Leg amplifier 1000 connected to the instrumentation absolute value differential amplifier 212. This amplifier is connected to Driven Right Leg electrode 1002. The Driven Right Leg electrode is clipped to the user's ear opposite the reference electrode (as shown in FIG. 11).

Figure 10:
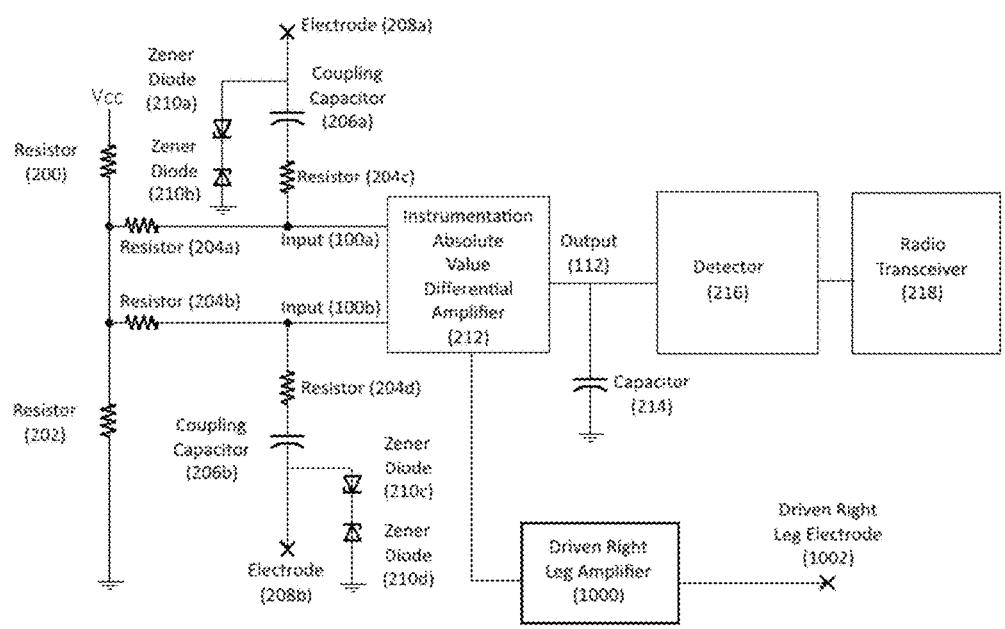
FIG. 10 shows an application EEG circuit with a Driven Right Leg amplifier and electrode.
Figure 11:
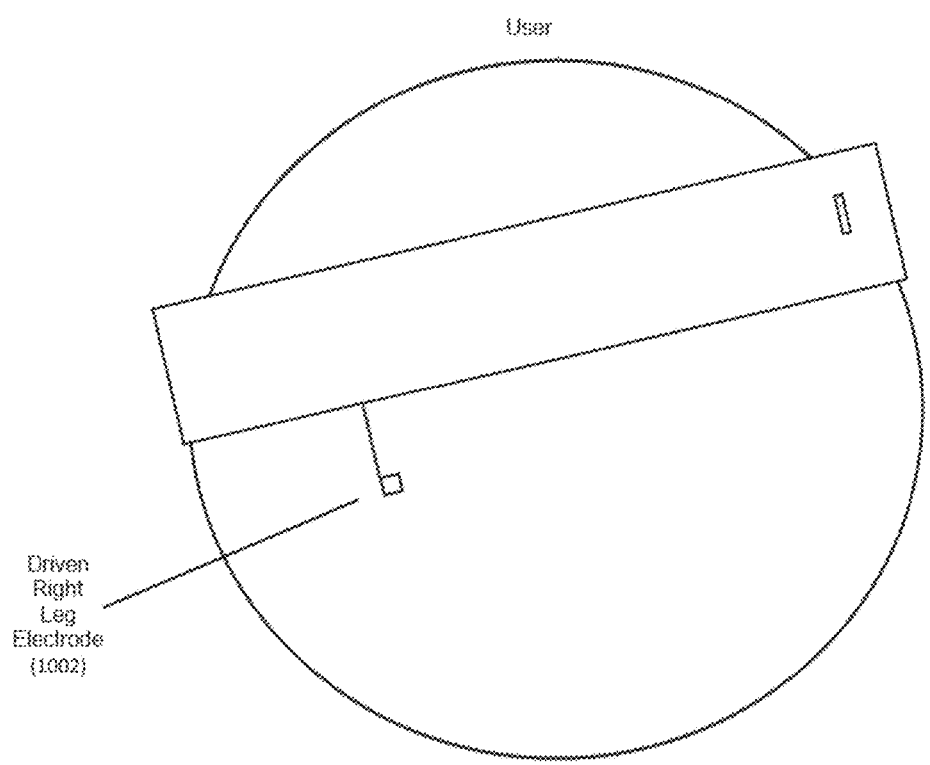
FIG. 11 shows an application headband with a Driven Right Leg electrode.

The embodiment shown in FIG. 10 sends current back to the user's body in order to reduce unwanted noise in the collected data. The driven right leg amplifier 1000 buffers the electrical signals measured by the instrumentation absolute value differential amplifier 212. These signals are sent back to the body through Driven Right Leg electrode 1002.

In another embodiment (FIG. 12) the electroencephalogram headband is replaced with an electrocardiogram arm band 1200. Two electrodes are connected to the arm band; Electrode 1202 attaches to the chest, while electrode 1204 attaches to the arm and provides a reference signal.

Figure 12:
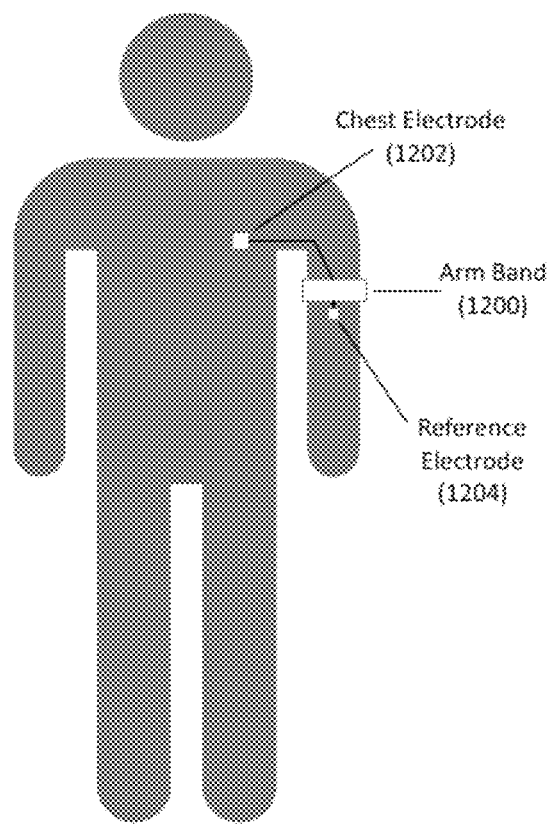
FIG. 12 shows an Electrocardiogram application of the Instrumentation Absolute Value Differential Amplifier.

The device shown in FIG. 12 uses an instrumentation absolute value differential amplifier to measure heart activity; all other circuit function is similar to the Electroencephalogram processing circuit. The electrodes 1202 and 1204 are used as inputs to the instrumentation absolute value differential amplifier application circuit, while the arm band 1200 contains and supports all circuit components.

In another embodiment (FIG. 13) the electroencephalogram headband is replaced with an electromyogram arm band 1300. Two electrodes are attached to the arm band—a muscle electrode 1302 and a reference electrode 1304.

Figure 13:
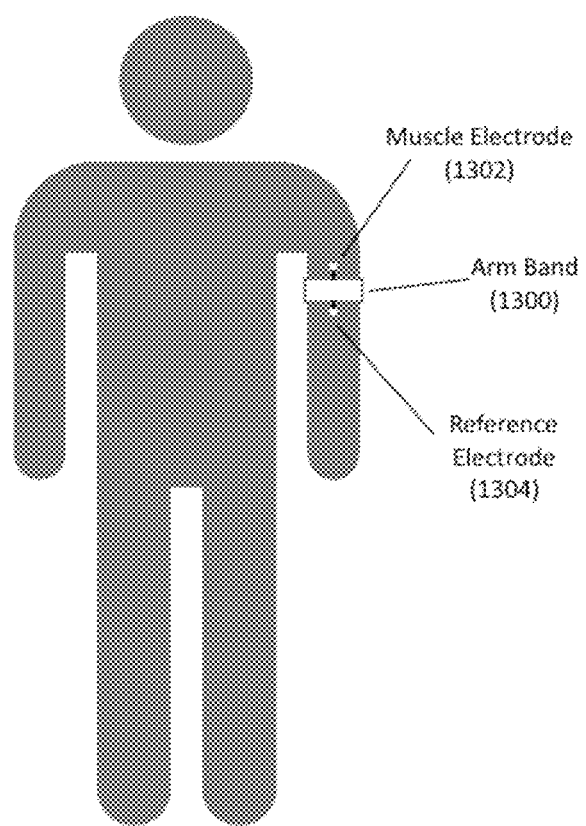
FIG. 13 shows an Electromyogram application of the Instrumentation Absolute Value Differential Amplifier.

The device shown in FIG. 13 uses an instrumentation absolute value differential amplifier to measure muscle activity; all other circuit function is similar to the Electroencephalogram processing circuit. The electrodes 1302 and 1304 are used as inputs to the instrumentation absolute value differential amplifier application circuit, while the arm band 1300 contains and supports all circuit components.

In another embodiment (FIG. 14) the communication between the headband and vibrator makes use of a network architecture for transmitting data. Headband 400 sends data wirelessly to transceiver 1400*a*, which is connected to personal computer 1402*a*. The computer 1402*a* sends information through an internet architecture 1404 to a computer 1402*b*. Computer 1402*b* has a transceiver 1400*b* attached; this transceiver sends a wireless signal to vibrator 500.

Figure 14:
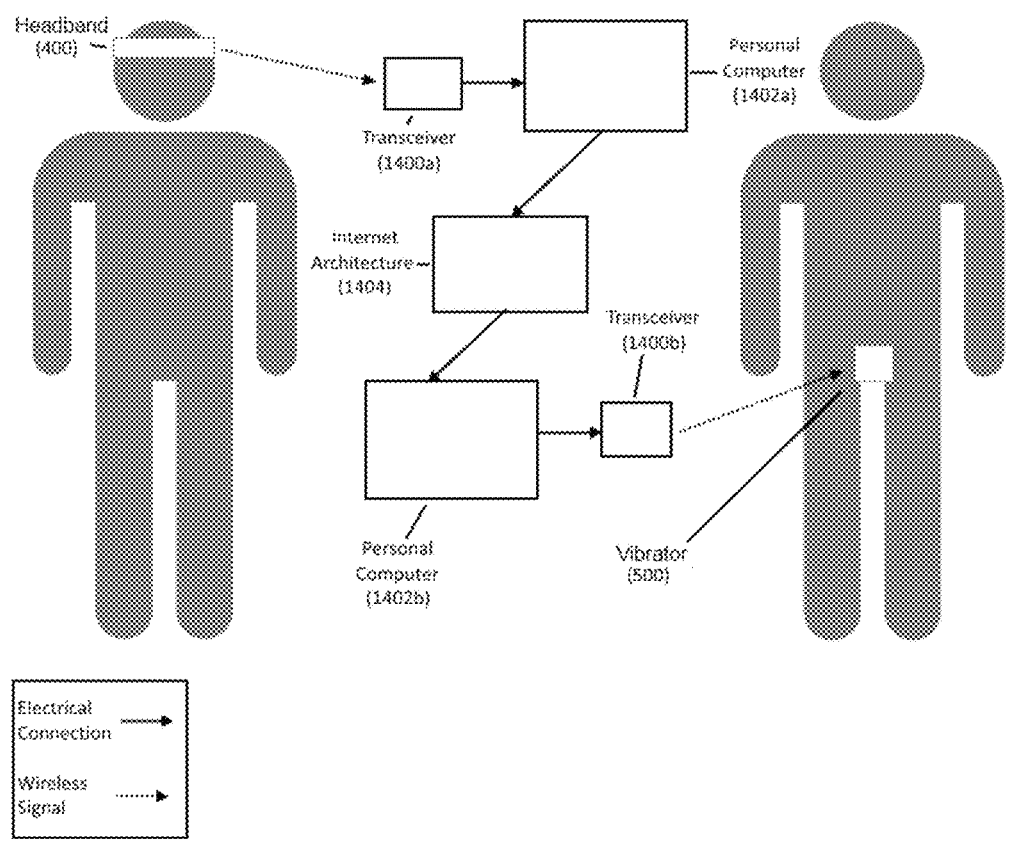
FIG. 14 shows an alternate embodiment using an internet connection between two partners.

The system shown in FIG. 14 uses network architecture to allow remote use of the headband-vibrator pair. Headband 400 generates data to be sent, which is received by Transceiver 1400*a*. This transceiver encodes the wireless signal into computer-readable signals, which are interpreted by Personal computer 1402*a*. Computer 1402*a* then sends these signals to computer 1402*b* using network architecture 1404. Personal computer 1402*b* sends this information to linked transceiver 1400*b*, which generates a wireless signal in response. This signal is sent to vibrator 500, controlling the vibrator.

In another embodiment (FIG. 15) the headband-vibrator connection includes a module that allows storage and later playback of recorded signals. An intermediate transceiver 1500 is connected to microcontroller 1502; this microcontroller is connected to a storage device 1504 and user control 1506. The transceiver 1500 is capable of receiving wireless signals from the headband 400 and sending wireless signals to a vibrator 500.

Figure 15:
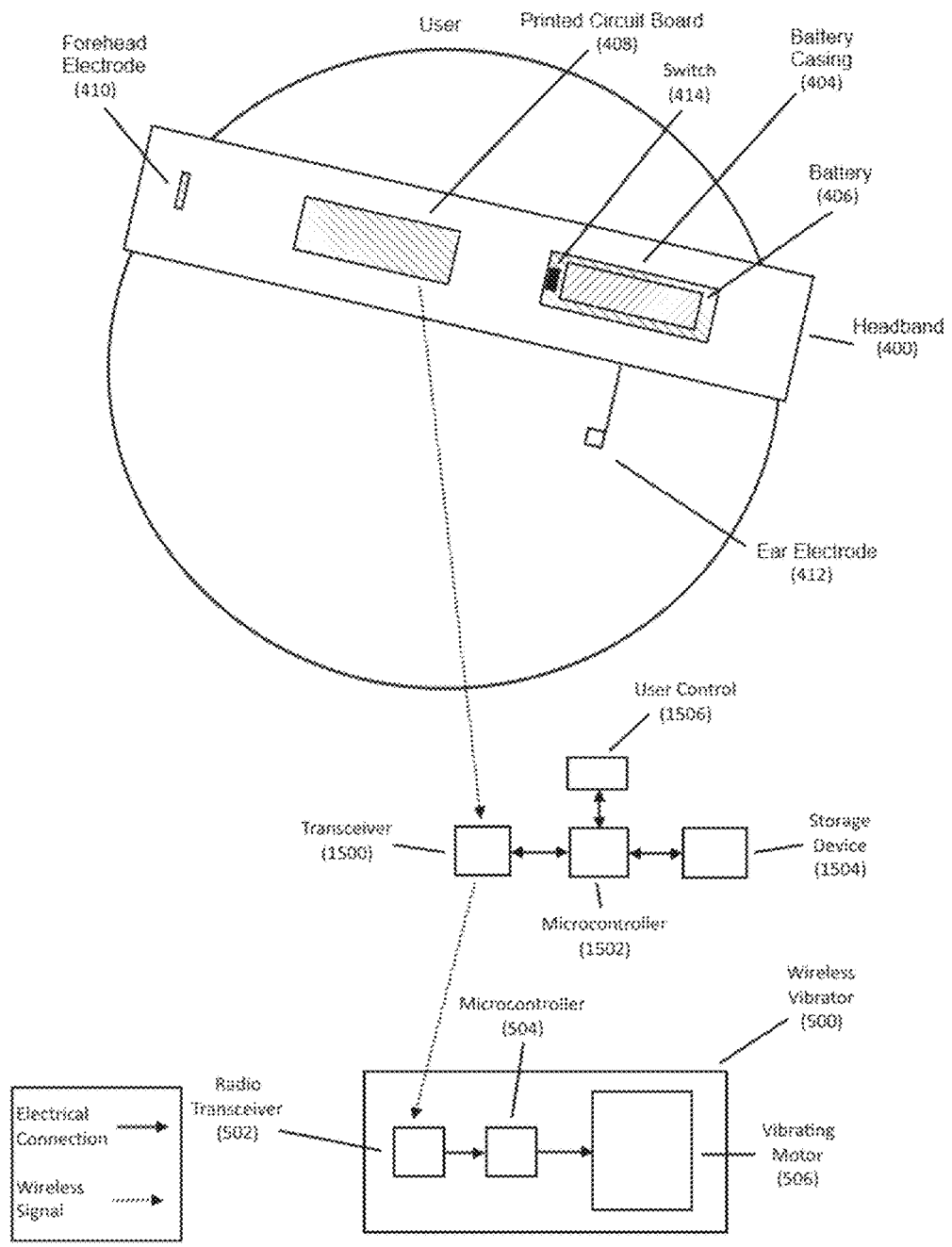
FIG. 15 shows a recording module for signal storage and later playback.

The embodiment shown in FIG. 15 makes use of an intermediate transceiver 1500 to allow storage and later playback of recorded signals. This transceiver receives signals from headband 400 and sends them to microcontroller 1502. The microcontroller stores these signals in storage device 1504. The user control 1506 allows the user to record, playback or clear the storage device as desired. If the user desires playback, the microcontroller reads values from storage device 1504 and sends them to transceiver 1500. These signals are then sent to vibrator 500.

In another embodiment (FIG. 16) the headband is used as a control device for a personal computer 1602. The computer is electrically connected to a receiving transceiver 1600 and has interaction software 1604 installed.

Figure 16:
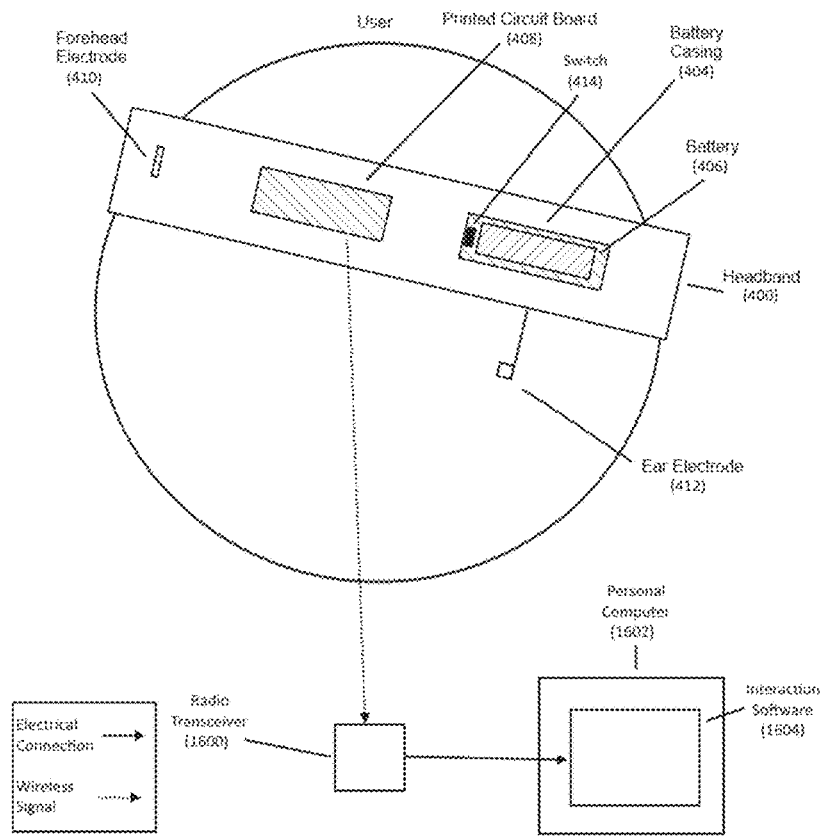
FIG. 16 shows an application headband paired to a transceiver module for personal computer control.

The embodiment shown in FIG. 16 allows the headband to be used as a control device for personal computer 1602. The wireless signals generated by the headband are received by a transceiver 1600, which transmits them to computer 1602 where they are interpreted using software 1604.

In another embodiment (FIG. 17) the headband is used as a control device for a video game 1700 running on a personal computer 1602. A transceiver 1600 is connected to computer 1602 running this video game.

Figure 17:
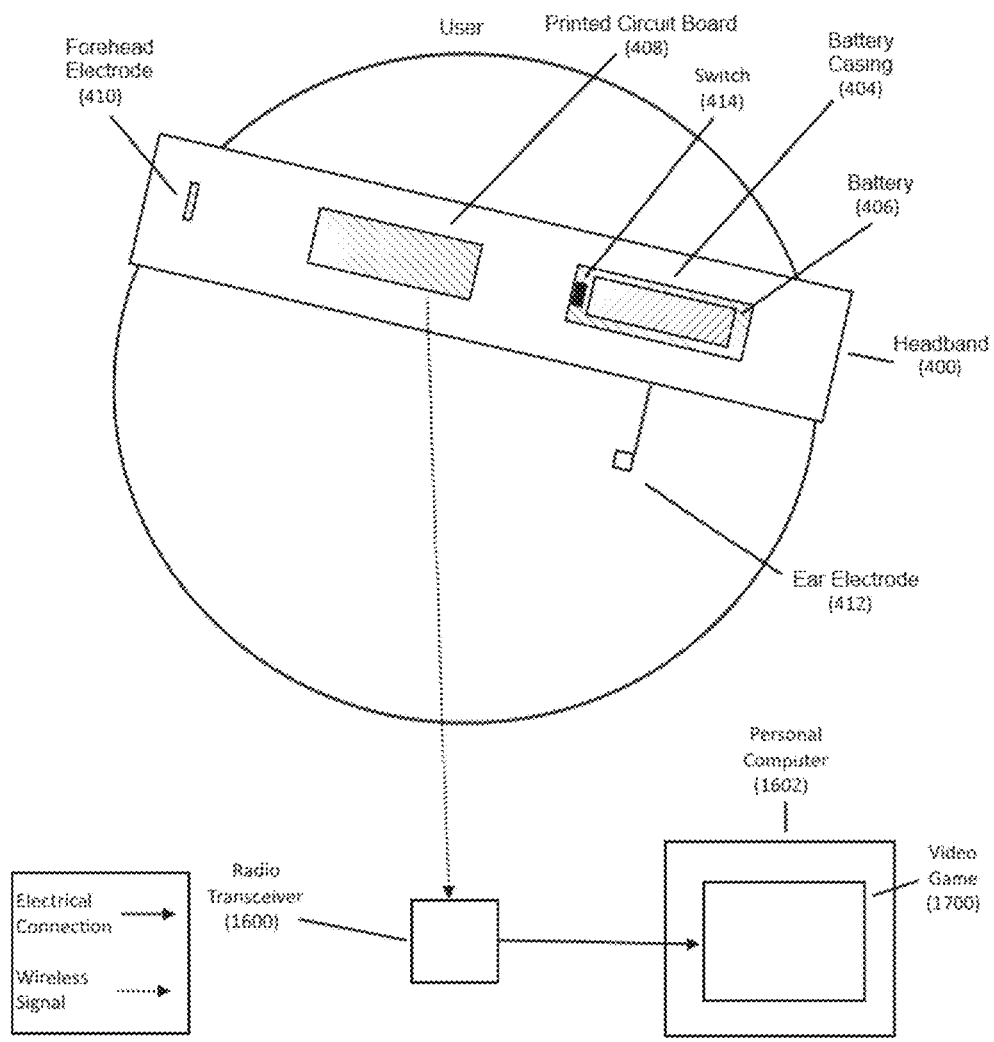
FIG. 17 shows an application headband paired to a transceiver module for video game interaction on a personal computer.

The embodiment shown in FIG. 17 allows the headband to be used as a control device for video game 1700. The wireless signals generated by the headband are received by a transceiver 1600, which transmits them to computer 1602 where they are used as control inputs for video game 1700.

In another embodiment (FIG. 18) the headband 400 is used as a musical instrument. The wireless signals generated by the headband 400 are received by a transceiver 1800, which is electrically connected to tone generator 1802. Tone generator 1802 is connected to a speaker 1804.

Figure 18:
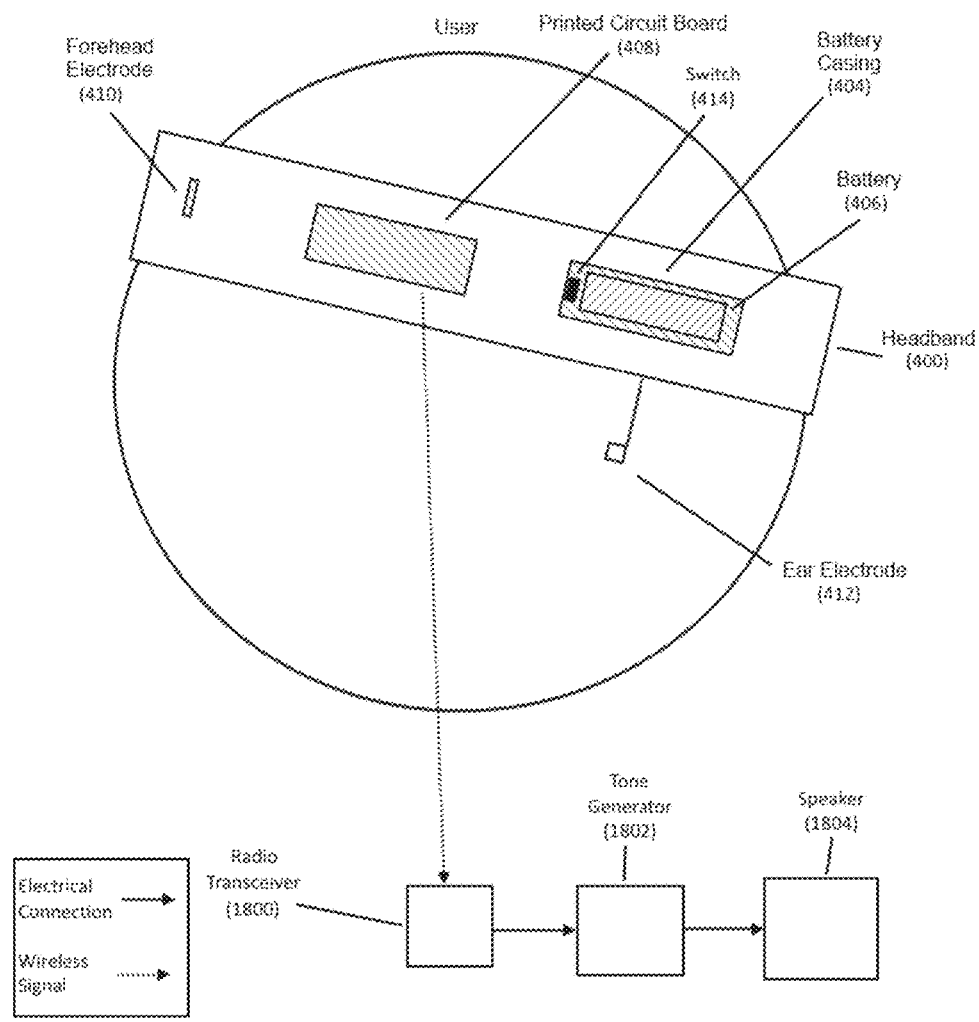
FIG. 18 shows an application headband paired to a speaker with audio output.

The embodiment shown in FIG. 18 allows the headband to be used to generate auditory tones. The wireless signals generated by the headband 400 are received by a transceiver 1800, which relays them to tone generator 1802. The tone generator creates auditory signals in response to measured physiological states and sends them to speaker 1804. Speaker 1804 transforms the electrical signals into sound.

In another embodiment (FIG. 19) the headband 400 is used as a controller for a remote-control toy 1906. The toy 1906 contains a transceiver 1900 which is electrically linked to a microcontroller 1902. The microcontroller 1902 is linked to one or more toy motors 1904 within the RC toy which control some parameter of the toy action (such as a toy car's speed).

Figure 19:
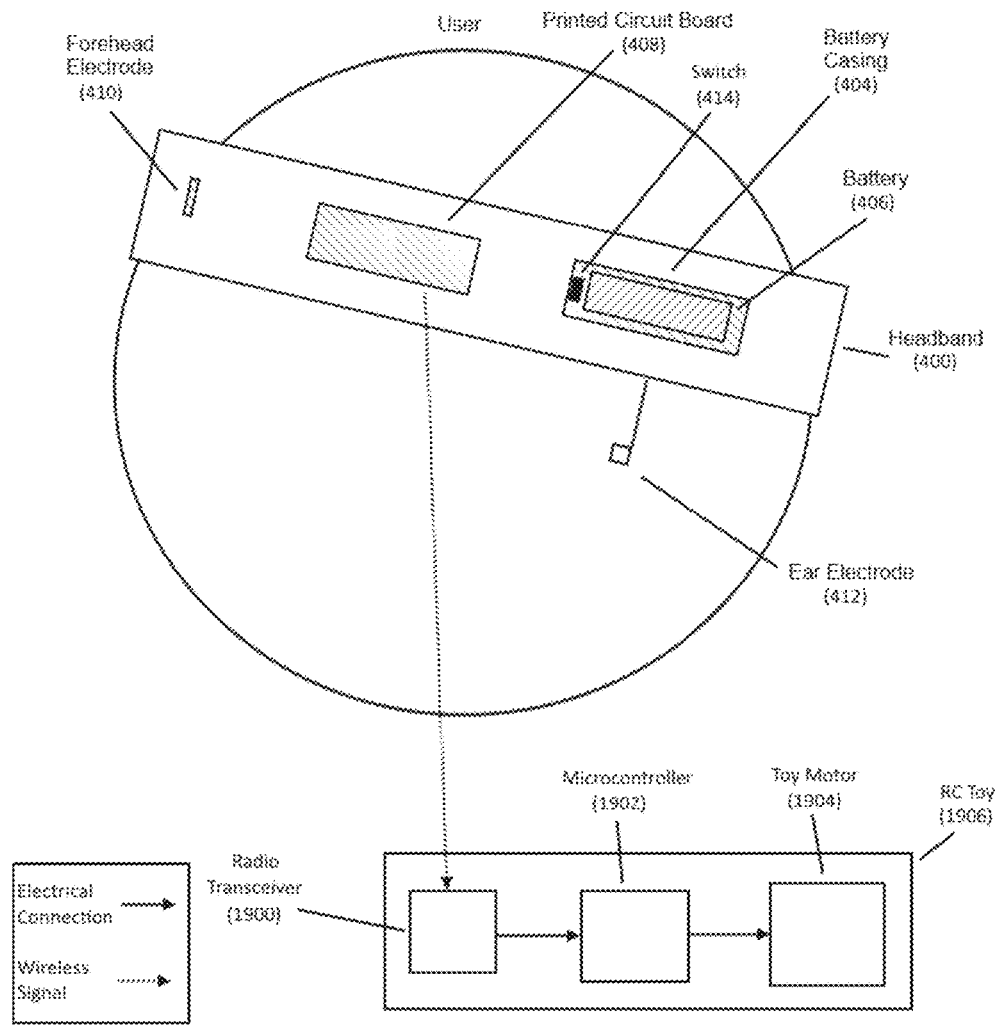
FIG. 19 shows an application headband paired to a Radio Controlled toy.

The embodiment in FIG. 19 allows the headband 400 to be used as a controller for a remote-control toy 1906. Transceiver 1900 within the toy receives signals sent from headband 400 and sends them to microcontroller 1902. This microcontroller uses the received signal to set the speed of one or more toy motors 1904, thus changing the control of toy 1906.

In another embodiment (FIG. 20) the headband 400 is used as a controller for a graphical display 2004. The graphical display 2004 contains a transceiver 2000 which is electrically linked to a microcontroller 2002. The microcontroller is linked to graphic display 2004.

Figure 20:
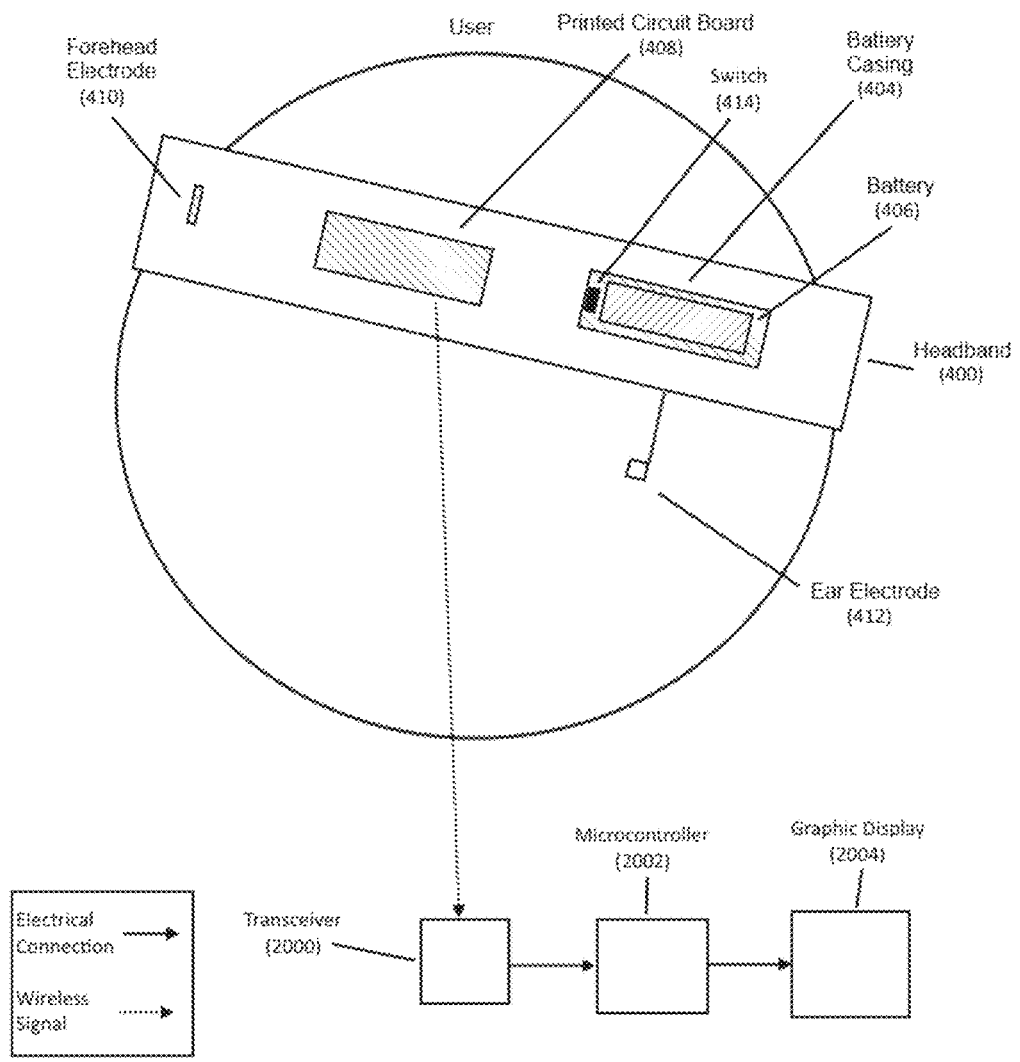
FIG. 20 shows an application headband paired with a Graphic Display Output.

The embodiment in FIG. 20 uses the headband 400 control signal to change the state of a graphical display 2004. A transceiver 2000 receives sent headband signals and relays them to a microcontroller 2002. This microcontroller performs analysis of said signals and sends the results as instructions for graphical display 2004. This display might be used to show the relative strength of the headband signals sent, the history of previous signals over a predetermined length of time, customized messages based on headband activity or other animation dependent on the headband state.

In another embodiment (FIG. 21) the detector is a logic circuit taking the amplified signal 2100 as an input. The signal is passed through a rectifier or low-pass filter 2102, then a comparator 2104. The output of this comparator is used as a digital control signal 2106.

Figure 21:
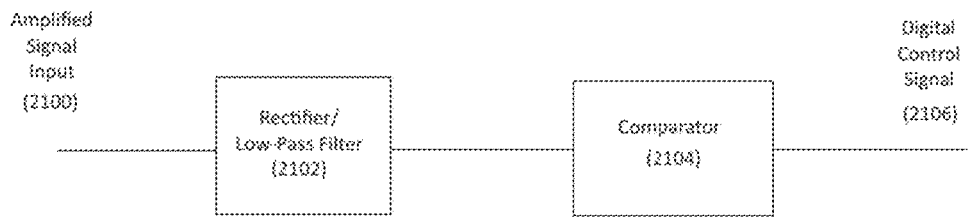
FIG. 21 shows an alternative logic circuit for converting the amplified signal to a digital output.

The embodiment shown in FIG. 21 works by low-pass filtering or rectifying the amplified signal 2100. The rectifier/low-pass filter amplifies the low-frequency content of signal 2100. A comparator 2104 then compares this signal to a given voltage. If the low-passed signal is greater than the given voltage, the digital output 2106 is set to a logic high state; if the signal is less than the given voltage, the output signal 2106 is set to a logic low state.

In another embodiment (FIG. 22) the capacitor is replaced with a complex filter 2200 within the application circuit.

Figure 22:
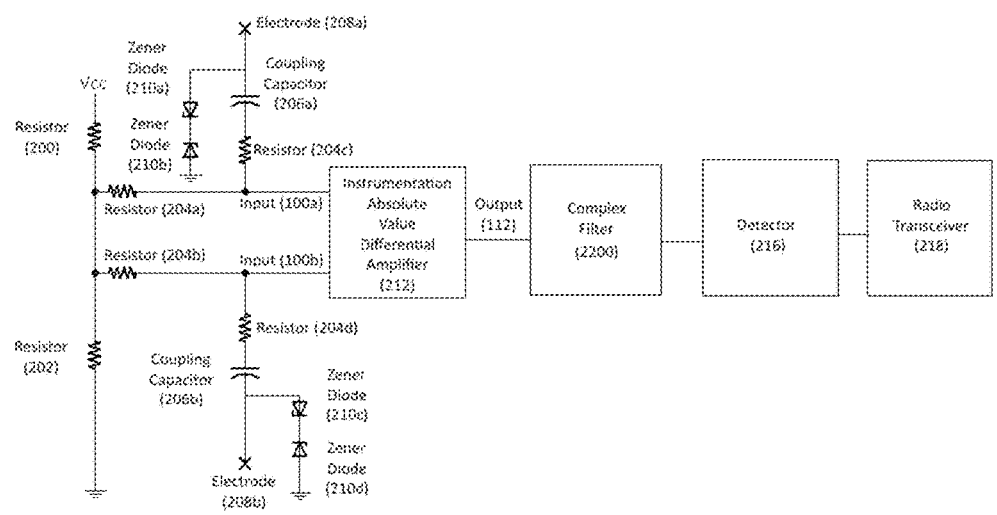
FIG. 22 shows an alternate application circuit using a complex filter.
Figure 23:
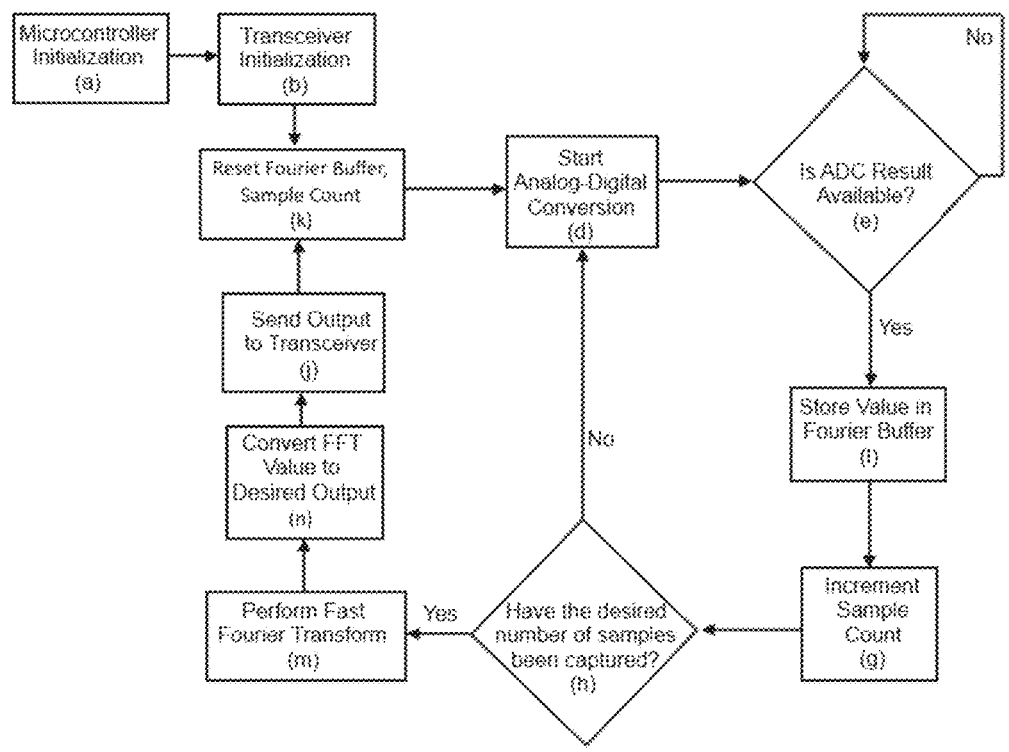
FIG. 23 shows a software flow chart using a Fast Fourier Transform processing algorithm.

The embodiment shown in FIG. 22 works to allow complex filtering of the amplified signal, providing either a low-pass, high-pass, band-pass or band-stop filter depending on the filter characteristics of filter 2200.

In another embodiment (FIG. 23) the microcontroller software makes use of frequency analysis with a Fast Fourier Transform and a Fourier buffer for sample storage. The software includes four additional states; in state k, a Fourier buffer is reset. In state l, values are added to the Fourier Buffer. In state m, the Fourier Buffer is analyzed using a Fast Fourier Transform (FFT). In state n, the output of the FFT is converted to the desired transceiver output.

CONCLUSIONS, RAMIFICATIONS AND SCOPE

Thus the reader will see that at least one embodiment of the mind-controlled sex toy provides a unique, novel yet economical device for sexual stimulation. While my above description contains many specificities, these should not be construed as limitations on the scope, but rather as an exemplification of one embodiment thereof. Many other variations are possible. For example, various safety features could be substituted, using paired transistors, coupling capacitors, varistors or other combinations of components to prevent electric shock to the user/device. The absolute value function could be performed by a rectifier circuit, with differential amplification performed prior to this rectifier. A virtual ground could be used to allow the Instrumentation Absolute Value Differential Amplifier to output values relative to a non-ground voltage. A single input signal could be buffered and compared to an internally generated voltage level instead of the second input signal. The coupling capacitors and/or resistors could be removed from the application circuit, allowing voltage levels to be read directly from the electrodes. The differential circuit and gain circuits could be separated such that a difference between two buffered input signals is first generated, then multiplied by a gain factor in a second stage. A power supply could be added to provide a constant voltage value. The filter could be implemented in hardware or software, of a low-pass, high-pass, band-pass, band-stop or notch design, active or passive. The microcontroller could be replaced with a hardware-specific state machine or other logic circuit. The paired sex toy could be a vibrator, penis pump, fleshlight, or other masturbatory/sexual aid. The communications protocol used to send data could be RF, ZigBee, Bluetooth, ANT, infrared, near field communication or other wireless transmission format. The wireless communication could be replaced with a direct electrical connection. The toy could either directly pair with a masturbatory aid or make use of a computer network to send control signals over long distances. The biofeedback information gathered could be stored and transmitted/replayed at a later time. The analysis algorithm could make use of a Fourier transform, frequency filtering, moving average, phase locked loop or other computational signal processing method. The means of controlling the device could be a push button, radio signal, graphical display, capacitive touch sensor or alternative user interaction device. The electrode sensors could be simple metal plates, wet or dry conductive electrodes, contoured to fit the user's skin or shaped as desired. The exterior case for the electroencephalogram could be a headband, set of contoured plastic bands or other electrode casing. The receiving device may be an RC toy, monitoring software, a wireless sex toy or another coupled device. The bio-electric sensors may be connected to the user's head (forming an electroencephalogram), chest (electrocardiogram), muscles (electromyogram) or other body locations. Accordingly, the scope should be determined not by the embodiments illustrated, but by the appended claims and their legal equivalents.

GLOSSARY OF TECHNICAL TERMS

Amygdalae: A brain area that performs a primary role in memory, decision making and emotional reaction.
Analog-to-Digital Converter (ADC): A device used to convert analog signals into digital representations, which are typically used to allow mathematical operations and storage within a microcontroller.
ANT: Wireless technology standard designed for sensor networks.
Bias Voltage: A voltage added to input values in order to ensure that signals are within the range that can be interpreted by an amplifier.
Bluetooth: Wireless technology standard for exchanging data over short distances.
Buffer Amplifier (Hardware): An operational amplifier circuit that takes one input signal and produces one output signal with a similar voltage, but larger current (which isolates the original signal from noise caused by later amplification).
Buffer (Software): A portion of memory allocated for temporary storage.

Capacitor: A passive component that acts as a charge barrier, allowing high-frequency signals to pass through but blocking low-frequency ones.

Circular Buffer: In software, a portion of memory allocated for temporary storage where values are overwritten in a pre-determined order, minimizing the number of reads/writes within the buffer.

Delta Wave: A brain wave signal with a frequency of oscillation between 0 and 4 hertz.

Differential Amplifier: A specific operational amplifier configuration that outputs the difference between two signals multiplied by a gain value.

Diode: Electronic component that allows current to flow in only one direction.

Dominant Hemisphere: The brain hemisphere opposite to an individual's preferred body side (for example, a right-handed person is typically left-brain dominant).

Driven Right Leg electrode: Electrode connected to the difference amplifier used to counteract frequencies in the human body resulting from exposure to electrical devices. These devices produce a 50/60 Hertz frequency that is not a result of brain activity; addition of a driven-right-leg electrode eliminates this interference.

Dual power supply: A power supply making use of both positive and negative voltages.

Electrocardiogram (ECG/EKG): A device used to measure heart activity through electrical response.

Electrode: A conductive material that allows measurement of electrical activity from an external source.

Electroencephalogram (EEG): A device used to measure brain activity in terms of electrical response (voltage levels). Typically uses a Fourier transform to separate electrical activity by frequency range.

Electromyogram (EMG): A device used to measure muscle activity by tracking electrical response.

Electrostatic Discharge (ESD): Static shock caused by different voltage levels between a circuit and an external source rapidly equalizing. Typically involves very high voltage but low current.

Fast Fourier Transform (FFT): A method of computing a Fourier Transform that minimizes the amount of necessary calculation.

Filter: A combination of electrical components that selectively distorts the frequencies present in the signal passed through it, effectively strengthening the desired frequencies and diminishing undesired noise.

Fourier Transform: A mathematical operation that calculates the relative strength of different frequencies present within a signal.

Gain Resistor: Resistor used to set an amplifier's gain value.

Gain: The ratio of an output signal's voltage level to an input signal's voltage level.

Ground: The portion of a circuit used as a reference voltage (typically the lowest voltage in the circuit).

Impedance: Resistance to current flow (for analysis of either Direct or Alternating Current Systems).

Infrared: A form of short-range wireless communication using infrared light.

Instrumentation Amplifier: A specialized amplifier circuit that amplifies the difference between two low-current input signals. Typically composed of two buffer amplifiers used as inputs to a differential amplifier.

Left Caudate Nucleus: A brain area involved in voluntary movement.

Microcontroller: An integrated circuit containing a programmable computer which is capable of reading, storing, performing mathematical operations on and outputting electrical signals.

Near Field Communication: A form of short-range wireless communication that creates a modulated electric or magnetic field, but not the electromagnetic waves used in radio communication.

Operational Amplifier: An electronic component used to amplify, buffer or perform other high-speed operations on one or more input signals. Usually packaged in single, double or quad integrated circuits.

Positron Emission Tomography: A nuclear imaging technique that produces three-dimensional scans of functional processes within the body.

Precision Instrumentation Amplifier: An instrumentation amplifier manufactured using high-precision components.

Quadrature: Mathematics used to describe a sinusoidal wave 90 degrees out of phase with a base signal.

Radio Transceiver: An electrical component that converts electronic signals to/from radio signals and can be used to send or receive these radio signals.

Rectifier: A circuit used to generate an absolute value of a given signal. A half-wave rectifier only outputs positive input signals, while a full-wave rectifier outputs positive signals and the inverse of negative input signals.

Resistor: A passive component that converts electrical energy to thermal energy, resulting in a voltage drop proportional to the component's resistance multiplied by the current run through it.

RF: Radio Frequency control scheme—generally used to refer to wireless transmission.

Single power supply: a power supply using only a single positive or negative voltage.

Vcc: The circuit power supply.

Virtual Ground: A voltage level that is not the circuit ground, but is treated as such by connecting it to an operational amplifier (meaning that the amplifier outputs voltages relative to this value).

Zener Diode: A type of diode that has a stable breakdown voltage (meaning that very negative voltages cause it to transmit current, but less negative voltages do not).

ZigBee: Radio Protocol used to create personal area networks between devices.

I claim:

1. A low-cost, low-precision biological-signal amplifier comprising:
    a) at least one signal electrode and at least one reference electrode, the at least one signal electrode referenced to the at least one reference electrode;
    b) a first buffer amplifier configured to produce a first buffered signal corresponding to a first signal electrode of the at least one signal electrode, said first buffered signal having lower impedance than a first source signal at the first signal electrode;
    c) a second buffer amplifier configured to produce a second buffered signal corresponding to a first reference electrode of the at least one reference electrode, said second buffered signal having lower impedance than a second source signal at the first reference electrode;
    d) a first differential gain amplifier configured to produce a first differential signal proportional to a difference between the first buffered signal and the second buffered signal;

e) a second differential gain amplifier configured to produce a second differential signal proportional to a difference between the second buffered signal and the first buffered signal; and f) a mixing circuit configured to emit an output signal, wherein the output signal equals the first differential signal when the first differential signal is greater than the second differential signal; and the output signal equals the second differential signal when the second differential signal is greater than the first differential signal.

2. The amplifier of claim 1, wherein the first buffer amplifier has unity gain.

3. The amplifier of claim 1, wherein the first differential gain amplifier has a gain between 1 and 1000000.

4. The amplifier of claim 1, wherein the mixing circuit comprises two diodes, an anode of a first of the two diodes coupled to an output of the first differential gain amplifier and an anode of a second of the two diodes coupled to an output of the second differential gain amplifier, and a cathode of each of the two diodes is coupled together.

5. A system comprising:

the amplifier according to claim 1;

a detector coupled to the output signal of the mixing circuit of the amplifier, said detector configured to emit an activation signal when a predetermined feature of the output signal of the mixing circuit of the amplifier is detected; and an electrically-controlled sexual stimulation device coupled to the detector so that the electrically-controlled sexual stimulation device is activated responsive to the activation signal.

6. The system of claim 5, wherein the detector is a programmable microcontroller.

7. The system of claim 5, wherein the electrically-controlled sexual stimulation device is a vibrator.

8. A system comprising:

the amplifier according to claim 1;

a detector coupled to the output signal of the mixing circuit of the amplifier, said detector configured to emit an activation signal when a predetermined feature of the output signal of the mixing circuit of the amplifier is detected; and an electrically-controlled user-feedback device coupled to the detector so that the electrically-controlled user-feedback device is activated responsive to the activation signal.

9. The system of claim 8, wherein the electrically-controlled user-feedback device is one of an auditory tone generator, video game controller, personal computer control device or Radio-Controlled toy.

* * * * *